(12) United States Patent
Ahn et al.

(10) Patent No.: US 10,469,201 B2
(45) Date of Patent: Nov. 5, 2019

(54) METHOD AND APPARATUS FOR CODING/DECODING IN A COMMUNICATION OR BROADCASTING SYSTEM USING HIGH-ORDER MODULATION

(71) Applicant: Samsung Electronics Co., Ltd., Suwon-si, Gyeonggi-do (KR)

(72) Inventors: Seokki Ahn, Suwon-si (KR); Hongsil Jeong, Suwon-si (KR); Seho Myung, Seoul (KR); Min Jang, Seongnam-si (KR); Kyungjoong Kim, Suwon-si (KR); Jaeyoel Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 15/980,092

(22) Filed: May 15, 2018

(65) Prior Publication Data

US 2018/0331783 A1 Nov. 15, 2018

(30) Foreign Application Priority Data

May 15, 2017 (KR) .................. 10-2017-0060142

(51) Int. Cl.
*H04L 1/00* (2006.01)
*H04L 27/18* (2006.01)
(Continued)

(52) U.S. Cl.
CPC .......... *H04L 1/0058* (2013.01); *H03M 13/13* (2013.01); *H03M 13/251* (2013.01);
(Continued)

(58) Field of Classification Search
CPC .... H03M 13/09; H03M 13/13; H03M 13/152; H03M 13/251; H03M 13/271;
(Continued)

(56) References Cited

U.S. PATENT DOCUMENTS

| 9,362,956 B2 * | 6/2016 | Mahdavifar | ........ H03M 13/296 |
| 2014/0208183 A1 * | 7/2014 | Mahdavifar | ........ H03M 13/296 |
| | | | 714/755 |
| 2016/0285479 A1 | 9/2016 | El-Khamy et al. | |
| 2018/0248567 A1 * | 8/2018 | Qu | ........ H03M 13/13 |

(Continued)

FOREIGN PATENT DOCUMENTS

| CN | 105099622 A | 11/2015 |
| CN | 106230489 A | 12/2016 |

OTHER PUBLICATIONS

Mathis Seidl et al. 'Polar-Coded Modulation', Friedrich-Alexander-University, Germany. Feb. 12, 2013. Retrieved from the Internet: <URL: https://arxiv.org/pdf/1302.2855.pdf>. See abstract; p. 4, right column, lines 4-14; p. 6, left column, lines 11-22; and figures 6, 8; Feb. 12, 2013.

(Continued)

*Primary Examiner* — John J Tabone, Jr.
(74) *Attorney, Agent, or Firm* — Jefferson IP Law, LLP

(57) ABSTRACT

The disclosure relates to a pre-5$^{th}$-Generation (5G) or 5G communication system to be provided for supporting higher data rates Beyond 4$^{th}$-Generation (4G) communication system, such as Long Term Evolution (LTE). A method for coding a channel in a communication system is provided. The method includes coding information to be transmitted with an outer code, generating an input sequence by allocating outer coded symbols sequentially from a sub-channel having a large capacity based on a polar code sequence, the input sequence having a value of $2^n$ and n being a preset value, coding the input sequence with the polar code, interleaving the polar coded symbols of the polar coded input sequence according to a predetermined scheme in consideration of a modulation symbol, and modulating the interleaved polar coded symbols.

22 Claims, 33 Drawing Sheets

(51) Int. Cl.
*H04L 27/34* (2006.01)
*H03M 13/27* (2006.01)
*H03M 13/13* (2006.01)
*H03M 13/25* (2006.01)
*H03M 13/00* (2006.01)
*H03M 13/15* (2006.01)
*H03M 13/09* (2006.01)
*H03M 13/29* (2006.01)

(52) U.S. Cl.
CPC ..... *H03M 13/271* (2013.01); *H03M 13/2792* (2013.01); *H03M 13/635* (2013.01); *H04L 1/0041* (2013.01); *H04L 1/0057* (2013.01); *H04L 1/0065* (2013.01); *H04L 1/0068* (2013.01); *H04L 1/0071* (2013.01); *H04L 27/18* (2013.01); *H04L 27/34* (2013.01); *H03M 13/09* (2013.01); *H03M 13/152* (2013.01); *H03M 13/2906* (2013.01)

(58) Field of Classification Search
CPC ......... H03M 13/2792; H03M 13/2906; H03M 13/635; H04L 1/0041; H04L 1/0057; H04L 1/0058; H04L 1/0065; H04L 1/0068; H04L 1/0071; H04L 27/18; H04L 27/34
USPC .................................................. 714/776, 752
See application file for complete search history.

(56) References Cited

U.S. PATENT DOCUMENTS

2018/0278269 A1* 9/2018 Jang ..................... H03M 13/13
2019/0165882 A1* 5/2019 You ..................... H04L 1/0013

OTHER PUBLICATIONS

International Search Report dated Aug. 21, 2018; International applicatin No. PCT/KR2018-005555.

* cited by examiner

FIG. 10A

| 0000 | 0100 | 1100 | 1000 |
| 0001 | 0101 | 1101 | 1001 |
| 0011 | 0111 | 1111 | 1011 |
| 0010 | 0110 | 1110 | 1010 |

FIG. 20

| 0 | 3 | 1 | 2 | 7 | 4 | 9 | 5 | 12 | 11 | 10 | 6 | 13 | 14 | 15 | 8 |
|---|---|---|---|---|---|---|---|----|----|----|---|----|----|----|---|
| 16 | 19 | 17 | 18 | 23 | 20 | 25 | 21 | 28 | 27 | 26 | 22 | 29 | 30 | 31 | 24 |
| 32 | 35 | 33 | 34 | 39 | 36 | 41 | 37 | 44 | 43 | 42 | 38 | 45 | 46 | 47 | 40 |
| 48 | 51 | 49 | 50 | 55 | 52 | 57 | 53 | 60 | 59 | 58 | 54 | 61 | 62 | 63 | 56 |

Intra-block interleaving (pre-defined) →

Inter-block interleaving (sequential) ↓

FIG. 22

| 0 | 3 | 1 | 2 | 7 | 4 | 9 | 5 | 12 | 11 | 10 | 6 | 13 | 14 | 15 | 8 |
| --- | --- | --- | --- | --- | --- | --- | --- | --- | --- | --- | --- | --- | --- | --- | --- |
| 35 | 33 | 34 | 39 | 36 | 41 | 37 | 44 | 43 | 42 | 38 | 45 | 46 | 47 | 40 | 32 |
| 17 | 18 | 23 | 20 | 25 | 21 | 28 | 27 | 26 | 22 | 29 | 30 | 31 | 24 | 16 | 19 |
| 50 | 55 | 52 | 57 | 53 | 60 | 59 | 58 | 54 | 61 | 62 | 63 | 56 | 48 | 51 | 49 |

↑ ↑ ↑ ↑

Cyclic shift by row index

FIG. 23

| | | | |
|---|---|---|---|
| 32 | 19 | 49 | 8 |
| 16 | 51 | 15 | 40 |
| 48 | 14 | 47 | 24 |
| 13 | 46 | 31 | 56 |
| 45 | 30 | 63 | 6 |
| 29 | 62 | 10 | 38 |
| 61 | 11 | 42 | 22 |
| 12 | 43 | 26 | 54 |
| 44 | 27 | 58 | 5 |
| 28 | 59 | 9 | 37 |
| 60 | 4 | 41 | 21 |
| 7 | 36 | 25 | 53 |
| 39 | 20 | 57 | 2 |
| 23 | 52 | 1 | 34 |
| 55 | 3 | 33 | 18 |
| 0 | 35 | 17 | 50 |

Cyclic shift by column index

METHOD AND APPARATUS FOR CODING/DECODING IN A COMMUNICATION OR BROADCASTING SYSTEM USING HIGH-ORDER MODULATION

CROSS-REFERENCE TO RELATED APPLICATION(S)

This application is based on and claims priority under 35 U.S.C. § 119(a) of a Korean patent application number 10-2017-0060142, filed on May 15, 2017, in the Korean Intellectual Property Office, the disclosure of which is incorporated by reference herein in its entirety.

BACKGROUND

1. Field

The disclosure relates to a method and an apparatus for transmitting and receiving a signal using error-correcting codes in a communication system. More particularly, the disclosure relates to a method and an apparatus for coding/decoding and modulation/demodulation a polar code.

2. Description of Related Art

To meet a demand for radio data traffic that is on an increasing trend since commercialization of a 4G communication system, efforts to develop an improved 5G communication system or a pre-5G communication system have been conducted. For this reason, the 5G communication system or the pre-5G communication system is called a beyond 4G network communication system or a post LTE system. To achieve a high data transmission rate, the 5G communication system is considered to be implemented in a very high frequency (mmWave) band (e.g., like 60 GHz band). To relieve a path loss of a radio wave and increase a transfer distance of the radio wave in the very high frequency band, in the 5G communication system, beamforming, massive MIMO, full dimensional MIMO (FD-MIMO), array antenna, analog beam-forming, and large scale antenna technologies have been discussed. Further, to improve a network of the system, in the 5G communication system, technologies, such as an evolved small cell, an advanced small cell, a cloud radio access network (cloud RAN), an ultra-dense network, a device to device communication (D2D), a wireless backhaul, a moving network, cooperative communication, coordinated multi-points (CoMP), and reception interference cancellation have been developed. In addition to this, in the 5G system, hybrid FSK and quadrature amplitude modulation (QAM) modulation (FQAM) and sliding window superposition coding (SWSC) that are an advanced coding modulation (ACM) scheme and a filter bank multi carrier (FBMC), a non-orthogonal multiple access (NOMA), and a sparse code multiple access (SCMA) that are an advanced access technology, and so on have been developed.

Meanwhile, the Internet is evolved from a human-centered connection network through which a human being generates and consumes information to the Internet of Things (IoT) network that transmits/receives information between distributed components, such as things and processes the information. The Internet of Everything (IoE) technology in which the big data processing technology, or the like, is combined with the IoT technology by connection with a cloud server, or the like, has also emerged. To implement the IoT, technology elements, such as a sensing technology, wired and wireless communication and network infrastructure, a service interface technology, and a security technology, have been required. Recently, technologies, such as a sensor network, machine to machine (M2M), and machine type communication (MTC) for connecting between things has been researched. In the IoT environment, an intelligent Internet technology (IT) service that creates a new value in human life by collecting and analyzing data generated in the connected things may be provided. The IoT may be applied to fields, such as a smart home, a smart building, a smart city, a smart car or a connected car, a smart grid, health care, smart appliances, and an advanced healthcare service, by fusing and combining the existing information technology (IT) with various industries.

Therefore, various tries to apply the 5G communication system to the IoT network have been conducted. For example, technologies, such as the sensor network, the machine to machine (M2M), and the machine type communication (MTC), have been implemented by techniques, such as the beamforming, the MIMO, and the array antenna that are the 5G communication technologies. The application of the cloud radio access network (cloud RAN) as the big data processing technology described above may also be considered as an example of the fusing of the 5G communication technology with the IoT technology.

In such a new communication system, there is a need for a method for coding and decoding using error-correcting code with improved performance.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method and an apparatus for coding/decoding and modulation/demodulation using an error-correcting code in a communication system.

Another aspect of the disclosure is to provide a method and an apparatus for coding/decoding and modulation/demodulation using a polar code.

Another aspect of the disclosure is to provide a method for coding/decoding and modulating/demodulating a polar code having better error-correcting performance in the case of using high-order modulation compared to the method of the related art which does not consider high-order modulation symbols.

Additional aspects will be set forth in part in the description which follows and, in part, will be apparent from the description, or may be learned by practice of the presented embodiments.

In accordance with an aspect of the disclosure, a method for coding a channel in a communication system is provided. The method includes coding information to be transmitted with an outer code, generating an input sequence by allocating outer coded symbols of the outer coded information sequentially from a sub-channel having a large capacity based on a polar code sequence, the input sequence having a value of $2^n$ and n being a preset value, coding the input sequence with the polar code, interleaving polar coded symbols of the polar coded input sequence according to a predetermined scheme in consideration of a modulation symbol, and modulating the interleaved polar coded symbols.

In accordance with an aspect of the disclosure, an apparatus for coding a channel in a communication system is provided. The apparatus includes an outer coder configured to code information to be transmitted with an outer code, a subchannel allocator configured to generate an input sequence by allocating outer coded symbols of the outer coded information sequentially from a sub-channel having a large capacity based on a polar code sequence, the input sequence having a value of $2^n$ and n being a preset value, a polar code coder configured to perform polar code coding on the polar code sequence in a predetermined scheme, an interleaver configured to interleave polar coded symbols of the polar coded input sequence by a predetermined scheme, and a modulator configured to modulate the interleaved polar coded symbols.

The effects that may be achieved by the embodiments of the disclosure are not limited to the above-mentioned objects. That is, other effects that are not mentioned may be obviously understood by those skilled in the art to which the disclosure pertains from the following description.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 10A and 10B are diagrams of constellation and possible bit labeling of a gray-mapped 16-quadrature amplitude modulation (QAM) modulation scheme according to various embodiments of the disclosure.

FIG. 20 illustrates an inter-block interleaving and intra-block interleaving of a final interleaver for a polar code in which a length of a mother matrix is 64 according to an embodiment of the disclosure.

FIG. 22 illustrates a cyclic shift intra-row permutation according to an embodiment of the disclosure.

FIG. 23 illustrates a cyclic shift intra-column permutation according to an embodiment of the disclosure.

Throughout the drawings, it should be noted that like reference numbers are used to depict the same or similar elements, features, and structures.

DETAILED DESCRIPTION

Figure 1:
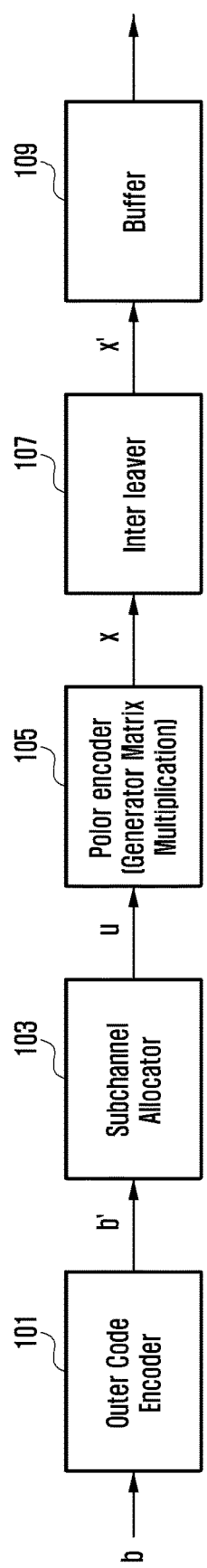
FIG. 1 is a diagram illustrating a process of coding a polar code considered according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

In describing embodiments of the disclosure, a description of technical contents which are well known to the art to which the disclosure belongs and are not directly connected with the disclosure will be omitted. This is to more clearly transfer a gist of the disclosure by omitting an unnecessary description.

For the same reason, some components are exaggerated, omitted, or schematically illustrated in the accompanying drawings. Further, the size of each component does not exactly reflect its real size. In each drawing, the same or corresponding components are denoted by the same reference numerals.

Various advantages and features of the disclosure and methods accomplishing the same will become apparent from the following detailed description of embodiments with reference to the accompanying drawings. However, the disclosure is not limited to the embodiments disclosed herein but will be implemented in various forms. The embodiments have made disclosure of the disclosure complete and are provided so that those skilled in the art can easily understand the scope of the disclosure. Therefore, the disclosure will be defined by the scope of the appended claims. Like reference numerals throughout the description denote like elements.

In this case, it may be understood that each block of processing flow charts and combinations of the flow charts may be performed by computer program instructions. Since these computer program instructions may be mounted in processors for a general computer, a special computer, or other programmable data processing apparatuses, these instructions executed by the processors for the computer or the other programmable data processing apparatuses create means performing functions described in block(s) of the flow charts. Since these computer program instructions may also be stored in a computer usable or computer readable memory of a computer or other programmable data processing apparatuses in order to implement the functions in a specific scheme, the computer program instructions stored in the computer usable or computer readable memory may also produce manufacturing articles including instruction means performing the functions described in block(s) of the flow charts. Since the computer program instructions may also be mounted on the computer or the other programmable data processing apparatuses, the instructions performing a series of operation stages on the computer or the other programmable data processing apparatuses to create processes executed by the computer to thereby execute the computer or the other programmable data processing apparatuses may also provide stages for performing the functions described in block(s) of the flow charts.

In addition, each block may indicate some of modules, segments, or codes including one or more executable instructions for executing a specific logical function (s). Further, it is to be noted that functions mentioned in the blocks occur regardless of a sequence in some alternative embodiments. For example, two blocks that are consecutively illustrated may be simultaneously performed in fact or be performed in a reverse sequence depending on corresponding functions sometimes.

Here, the term '-unit' used in the embodiment means software or hardware components, such as a field programmable gate array (FPGA) and an application specific integrated circuit (ASIC) and the '~unit' performs any roles. However, the meaning of the '~unit' is not limited to software or hardware. The '~unit' may be configured to be in a storage medium that may be addressed and may also be configured to reproduce one or more processor. Accordingly, for example, the '~unit' includes components, such as software components, object oriented software components, class components, and task components and processors, functions, attributes, procedures, subroutines, segments of program code, drivers, firmware, microcode, circuit, data, database, data structures, tables, arrays, and variables. The functions provided in the components and the '~units' may be combined with a smaller number of components and the '~units' or may be further separated into additional components and '~units'. In addition, the components and the '~units' may also be implemented to reproduce one or more central processing units (CPU)s within a device or a security multimedia card.

A polar code is an error-correcting code and has excellent decoding performance and low complexity. In addition, in the case of the polar code, and is a code capable of achieving channel capacity which is a data transmission limit in all binary discrete memoryless channels ("B-DMC"). In addition, the polar code has performance similar to that of a turbo code and a low-density parity-check (LDPC) code, which are different channel capacity proximity codes, and has an advantage in performance in a case of transmitting a short-length code compared with other codes. Therefore, it is possible to transmit/receive a signal using a polar code in the communication system. More specifically, the use of the polar code may be considered for transmission of control information of a certain length or less.

In addition, the polar code is an error-correcting code that may be defined based on the phenomenon of channel polarization under the assumption of the B-DMC. In the case of using a modulation scheme, such as quadrature phase shift keying (QPSK), when code bits of the polar code are transmitted, each bit may pass through a channel W having independent and statistically identical characteristics. In this case, if the channel capacity of each channel is $0 \leq C(W) \leq 1$, this means that information may be transmitted by $C(W)$ bits theoretically when any one bit is transmitted through a channel. When N bits are transmitted through the B-DMC without any operation, all channels on which each bit is transmitted have a channel capacity of $C(W)$, and information corresponding to a total of $N \times C(W)$ bits may be transmitted theoretically. The basic concept of the channel polarization is that an operation of combining (channel combining) and splitting (channel splitting) channels through which N bits pass is performed to control a channel capacity of an effective channel, which bits having a specific ratio experience, to be close to 1 and a channel capacity of an effective channel, which the remaining bits experience, to be close to 0. In this way, the polar code will be conceptually explained simply. The transmission effect may be maximized by a method for transmitting a previously promised specific value without carrying the information bits on the channel having the lower channel capacity.

Hereinafter, a process of coding a polar code will be described with reference to the accompanying drawings.

FIG. 1 is a diagram illustrating a process of coding a polar code considered according to an embodiment of the disclosure.

Referring to FIG. 1, the number of information bits to be transmitted during a coding process is assumed to be K and the number of codeword bits which is coded and transmitted on a channel is assumed to be N.

1) Information Bit Generation

An information bit sequence $b=\{b_0, b_1, \ldots, b_{K-1}\}$ be transmitted is input to an outer code encoder 101.

2) Outer Code

The information bit sequence b is usually coded in an outer code for performance enhancement. As the outer code to be used, an error detection code, such as a cyclic redundancy check (CRC) code or an error-correcting code, such as a Bose, Chaudhuri, and Hocquenghem (BCH) code and a single parity check code may be used. If a length of parity generated by the outer code is $K_{outer}$, a bit sequence resulting from the outer coding may be expressed by $b'=\{b_0', b_1', \ldots, b_{K+K_{outer}-1}'\}$. Since the outer coding is not an essential operation, if the outer coding is not considered, $K_{outer}=0$, $b'=b$.

3) Subchannel Allocation

A bit sequence b' is mapped to a bit sequence $u=\{u_0, u_1, \ldots, u_{N_0-1}\}$ having a length of $N_0$ for polar code encoding. The $N_0$ is a magnitude of the mother polar code and is a power of two, and determined by a predefined criterion. u is an input bit sequence of the polar code encoding and each bit of u may be interpreted as if it passes through different qualities of subchannels due to the channel polarization effects. Because of these features, a process of mapping b' to u is referred to as a subchannel allocation process. This subchannel allocation is performed in a subchannel allocator 103, and the subchannel allocation process of the general polar code performed in the subchannel allocator 103 may include the following three stages.

Stage 1) Determine a position of a subchannel on which information may not carried by puncturing or shortening performed to adjust a length of a code after coding. If the number of bits to be punctured/shortened after the coding is $N_p$, $N_p$ bits of the bit sequence u pass through an incapable subchannel or a shortened subchannel. The incapable subchannel is generated when a codeword bit is generated in a transmitter and then is not transmitted. In addition, if the transmitter fixes a punctured bit value to a specific value (0 or 1) and assumes that the receiver knows the specific value, the shortened subchannel is generated. The case in which the punctured bit value is fixed to the specific value is also referred to as the shortening. The position of the incapable/shortened subchannel is coded and then determined depending on the positions of the punctured bits. Positions of bits corresponding to the position of the incapable/shortened subchannel is determined. The above stage 1 is not performed when there is no puncturing (or shortening) bit.

Stage 2) Each bit of the input bit sequence b' is mapped to bits except for the position of the incapable/shortened bit determined in the above stage 1 of u. The positions of bits in the u sequence to which a bit of b' is to be mapped is determined by the channel capacity of the subchannel through which each bit of u should pass. In general, b' is mapped so that it may be transmitted on a subchannel having the largest channel capacity among the subchannels of u. For this purpose, a sequence in which the subchannel indexes of u are arranged in order of the channel capacity is used, which is called a polar code sequence. The channel capacity may be expressed by reliability of bits. The polar code sequence may be stored in a transmitter/receiver memory or may be obtained by a specific operation at each transmission/reception. In addition, the polar code sequence may also be configured by high-layer signaling (or a radio resource control (RRC) signaling) or even by a control signal of a MAC CE or an L1 layer. Other methods may be defined in standard specifications.

In the process of mapping each bit of the input bit sequence b' to u, a predetermined number of parity bits related to the input bit sequence b' are generated by a pre-coding operation, and both of the input bit sequence and the corresponding parity bit may also be mapped to u. In this case, each parity bit is generated by a linear combination of certain bits in the input bit sequence, and may be generated and included in u to enhance the performance of the polar code.

Stage 3) In a u vector, the bits not allocated by the above stages 1 and 2 are called a frozen bit. As a result, the information may be transmitted by the above stages 1 and 2. However, the bit passing through the subchannel having a relatively low channel capacity becomes the frozen bit. The frozen bit is determined by the value that the transmitter/receiver promises to each other, which is usually fixed to zero.

4) Polar Encoder

An output bit string u of the subchannel allocator 103 is input to the polar encoder 105. The polar encoder 105 receives a bit stream vector u and outputs a polar encoded bit stream x by coding a polar code. A length of the vector x has the same $N_0$ as the vector u and satisfies the following Equation 1. A product of a generator matrix included in the polar encoder 105 may be implemented in various ways.

$$x=uG \qquad \text{Equation 1}$$

The bit sequence u having the length of $N_0$ is multiplied by a generator matrix G of the polar code to generate the bit sequence x having a length of $N_0$. The generator matrix G which is first proposed by Arikan is as the following Equation 2.

$$G=B_{N_0}F^{\otimes \lceil \log_3 N_3 \rceil} \qquad \text{Equation 2}$$

In the above Equation 2, $$F = \begin{bmatrix} 1 & 0 \\ 1 & 1 \end{bmatrix},$$

and a superscript $\otimes n$ operation means n Kronecker power. For example, $$F^{\otimes 2} = \begin{bmatrix} F & 0 \\ F & F \end{bmatrix}, \text{ and } F^{\otimes 3} = \begin{bmatrix} F^{\otimes 2} & 0 \\ F^{\otimes 2} & F^{\otimes 2} \end{bmatrix}$$

is as the following Equations 3 and 4.

$$F^{\otimes 2} = \begin{bmatrix} F & 0 \\ F & F \end{bmatrix} = \begin{bmatrix} 1 & 0 & 0 & 0 \\ 1 & 1 & 0 & 0 \\ 1 & 0 & 1 & 0 \\ 1 & 1 & 1 & 0 \end{bmatrix} \quad \text{Equation 3}$$

$$F^{\otimes 3} = \begin{bmatrix} F^{\otimes 2} & 0 \\ F^{\otimes 2} & F^{\otimes 2} \end{bmatrix} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Equation 4}$$

It is possible to consider a generator matrix as the following Equation 5, which is a simple form except for $B_{N_0}$.

$$G = F^{\otimes \log_2 N_0} \quad \text{Equation 5}$$

A difference between the two generator matrices described above is whether to perform a $B_{N_0}$ matrix product. The matrix $B_{N_0}$ is a matrix in which bit reversal is performed on a length of $N_0$ and is a bit-reversal permutation matrix having a size of $N_0 \times N_0$. For example, $\{a_0, a_1, a_2, a_3, a_4, a_5, a_6, a_7\}$ is multiplied by $B_8$ to obtain $\{a_0, a_4, a_2, a_6, a_1, a_5, a_3, a_7\}$.

Therefore, the difference between the two generator matrices is a difference between the case in which the outcome is relocated in the bit-reversal and the case in which the outcome is not located in the bit-reversal again. The disclosure is described under the assumption that the generator matrix is basically given as $G = B_{N_0} F^{\otimes \log_2 N_0}$, but is not limited thereto. In some cases, when a separate description is required, the case of $G = F^{\otimes \log_2 N_0}$ may be described additionally.

5) Interleaving and Coding Rate Adjustment

The bit sequence x having the length of $N_0$, which is generated by the bit sequence u and the generator matrix, is input to the interleaver 107 to be interleaved. The interleaving may relocate positions of bits in units of bit, or groups a predetermined bit unit to relocate positions of groups. Some of the interleaved bits may be punctured or shortened for the rate matching, and some bits thereof may be repeated.

The interleaving scheme is previously determined and may be changed according to a coding rate, a modulation scheme, a length of an input bit, a UE category, and downlink/uplink. The conditions may be configured (e.g., via higher-layer/RRC signaling or medium access control (MAC) control element (CE) or L1 DL control) in the base station or fixed in a particular manner.

As an example of the rate matching, a virtual circular buffer may be used. The interleaved bit sequence is successively stored in a virtual circular buffer, where N bits are successively loaded and is configured as symbols by the modulation and transmitted. Here, the transmitted symbols generally represent quadrature amplitude modulation (QAM) symbols and do not restrict the use of other types of modulation schemes, that is, modulation schemes other than the QAM modulation scheme. For example, if $N<N_0$, $N_0-N$ bits are punctured or shortened in a reverse order to the order stored in the virtual circular buffer. On the other hand, if $N>N0$, $N-N_0$ bits are repeated in the order stored in the virtual circular buffer.

More specifically, the rate-matching method for generating a codeword vector having a length of N to be actually transmitted from the vector x having a coded length of No may be divided into the following three types according to a value of N.

First, when $N=N_0$, x is transmitted as it is.

Second, if $N_0>N$, $N_0-N$ bits are subtracted from the x vector, and the remaining bits are transmitted. Here, the bits, which are not transmitted, may be punctured, and may be handled as the known bits, that is, the shortened bits. Since the positions of bits to be punctured or shortened within the x vector affect the performance, the bits to be punctured/shortened may be determined. More specifically, the transmission channel may substantially select at least one of the bits punctured and shortened based on the performance depending on the positions of bits.

Third, if $N_0<N$, $N_0-N$ bits are repeatedly transmitted in the x vector. Like the punctured case, the performance is changed depending on the positions of the repeated bits in the x vector, thus the bits to be repeated and the positions of the bits to be repeated may be determined in consideration of this. Even in this case, the transmission channel may substantially determine the positions of the bits to be repeated based on the performance depending on the positions of the bits.

Figure 2:
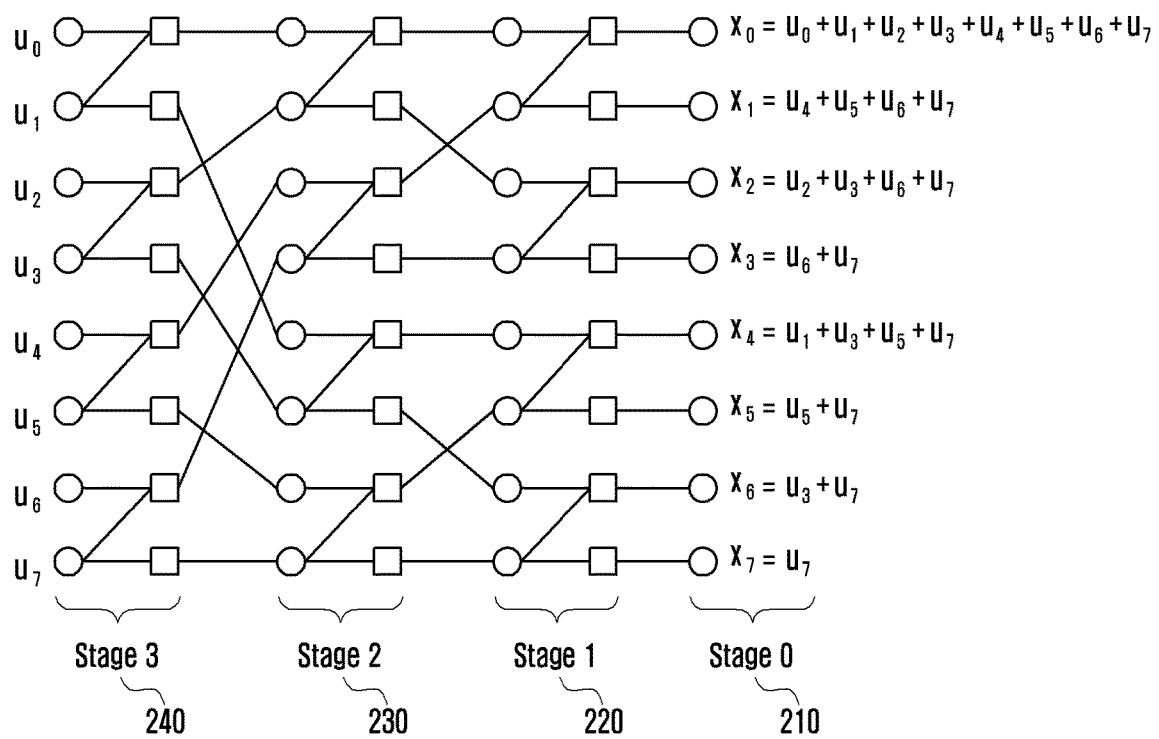
FIG. 2 is a diagram illustrating a structure of a polar code according to an embodiment of the disclosure.

FIG. 2 is a diagram illustrating a structure of a polar code according to an embodiment of the disclosure.

Referring to FIG. 2, the structure of the polar code in which $N_0=8$, and the generator matrix is given as $G = B_{N_0} F^{\otimes \log_2 N_0}$ is disclosed. More specifically, given as $G = B_{N_0} F^{\otimes \log_2 N_0}$ in the case of $N_0=8$, the coding process, such as $x = uG$ is expressed on a bipartite graph. A calculation process using the bipartite graph may be represented by each stage 210 to 240. In addition, the leftmost variable nodes on the graph represent each bit of the bit vector u before being coded, and the vector x after the rightmost variable nodes on the graph represent the vector x after being coded.

In addition, in this case, the generator matrix G may be expressed by the following Equation 6.

$$G_8 = B_8 F^{\otimes 3} = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix} \quad \text{Equation 6}$$

In the embodiment of the disclosure, the bipartite graph of the polar code having a length of $N_0$ may be configured in such a manner that a structure of a total $\log_2 N_0$ stage is repeated. In each stage index on the graph, the leftmost is $\log_2 N_0$ (stage 3 240 in the embodiment) and the rightmost is stage 0 210. In the graph, each circle is referred to as a variable node, and a bit value represents 0 or 1. In addition, each quadrangle is a check node indicating that a binary sum (modulo-2 sum, XOR) of all connected variable node values is 0. The coding and decoding of the polar code may be made based on this linear equation relationship between the variable node and the check node.

The coded vector may be generated from the input bit vector based on the bipartite graph or the generator matrix.

Figure 3:
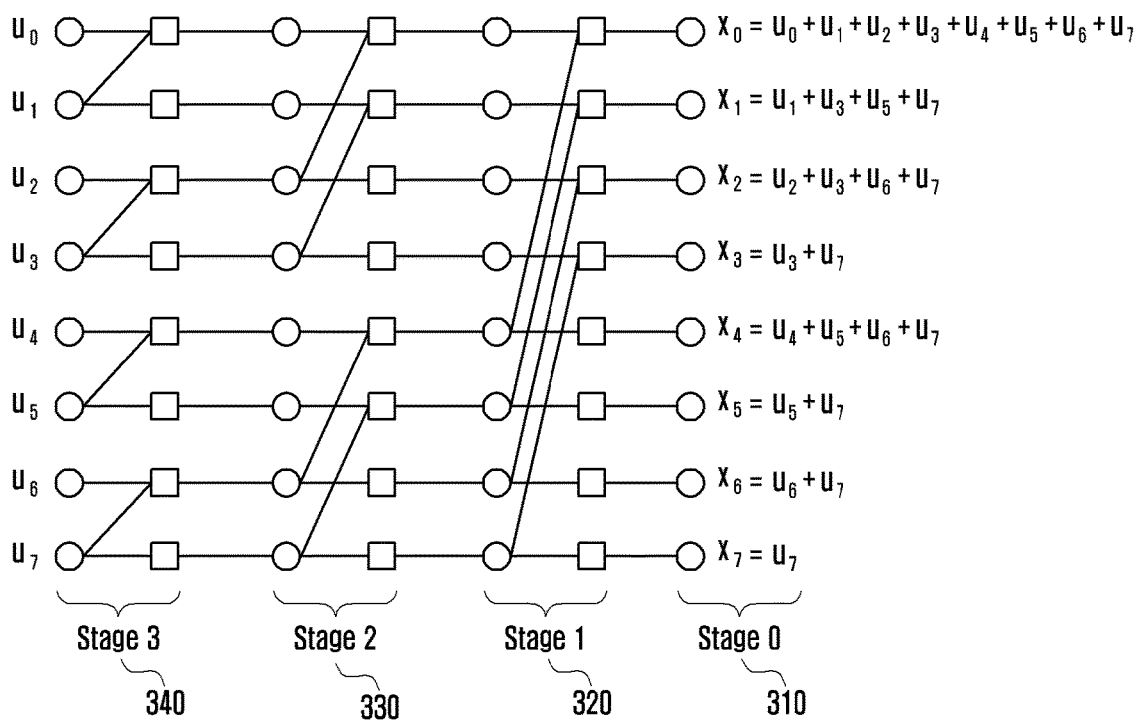
FIG. 3 is a diagram illustrating a structure of a polar code according to an embodiment of the disclosure.

FIG. 3 is a diagram illustrating a structure of a polar code according to an embodiment of the disclosure.

Referring to FIG. 3, the structure of the polar code in which $N_0=8$, and the generator matrix is given as $G=F^{\otimes \log_2 N_0}$ is disclosed. More specifically, given as $G=F^{\otimes \log_2 N_0}$ in the case of $N_0=8$, the relational expression and the coding process, such as $x=uG$ are exemplarily represented on the bipartite graph. In this case, the generator matrix G is expressed by the following Equation 7.

$$G_8 = F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Equation 7}$$

The graph for $G=F^{\otimes \log_2 N_0}$ of FIG. 3 also has a feature corresponding to $G=B_{N_0}F^{\otimes \log_2 N_0}$ of FIG. 2, except that only the connection types between variable nodes and check nodes are different. The coding and decoding processes may be represented by each stage 310 to 340 and may be progressed correspondingly, regardless of which of two different types of generator matrixes and bipartite graphs described above is used. The coded vector may be generated from the input bit vector based on the bipartite graph or the generator matrix.

Figure 4:
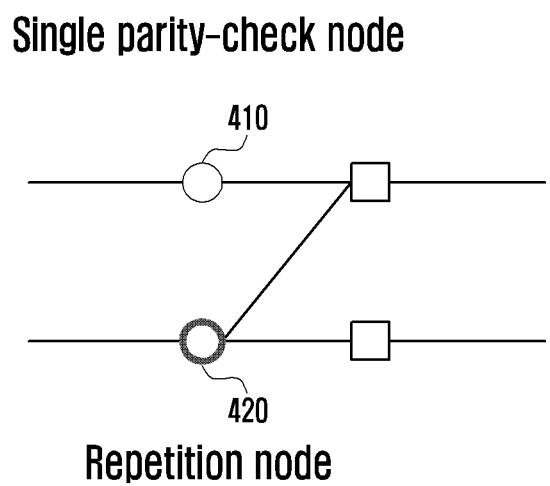
FIG. 4 is a diagram illustrating components of a graph for applying a polar code according to an embodiment of the disclosure.

FIG. 4 is a diagram illustrating components of a graph for applying a polar code according to an embodiment of the disclosure.

Referring to FIG. 4, the basic components of the polar code graph are disclosed. More specifically, the graphs of FIGS. 2 and 3 may include the basic components of FIG. 4 and may be the form in which the basic components are connected. In the embodiment of the disclosure, a variable node connected only to one check node may be referred to as a single parity-check node 410 and a variable node connected to two check nodes may be referred to as a repetition node 420. In the embodiment of the disclosure, each of the variable nodes 410 and 420 performs different operations at the time of decoding.

Figure 5:
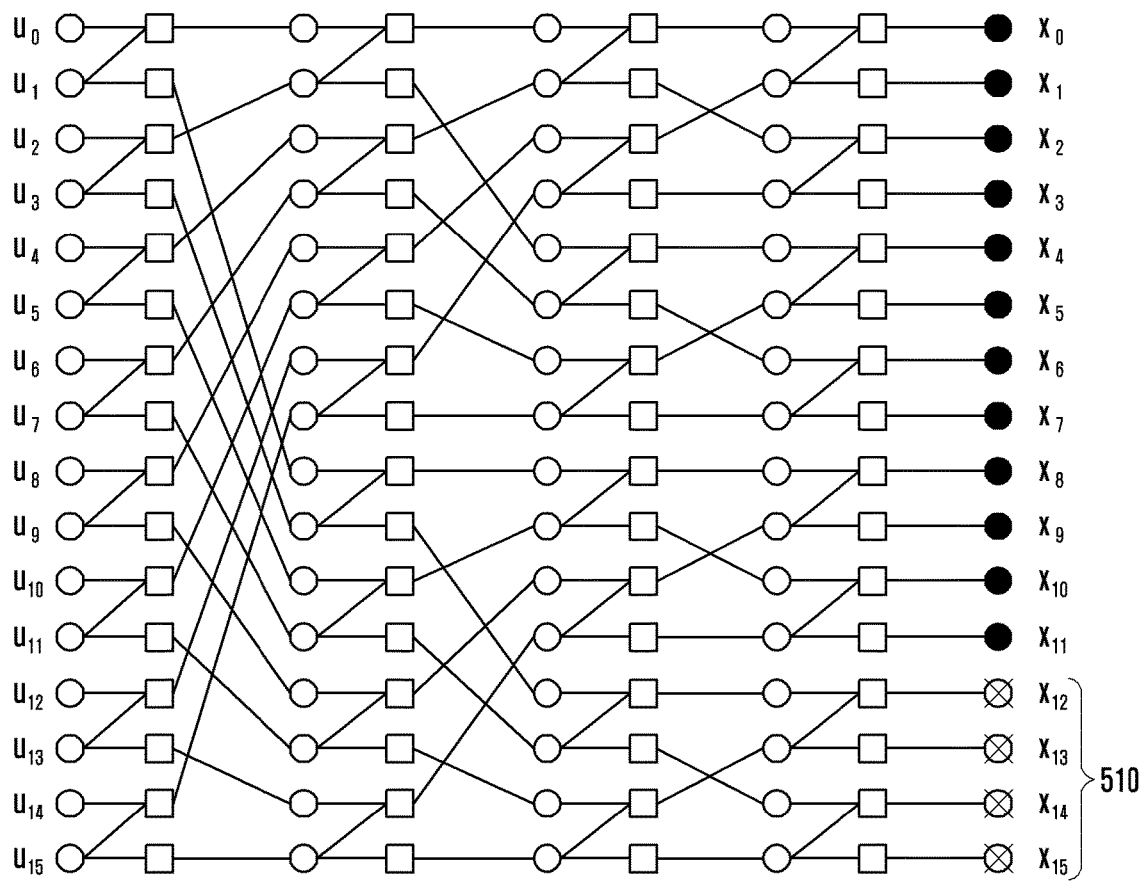
FIG. 5 illustrates a rate-matching method based on puncturing/shortening according to an embodiment of the disclosure.

FIG. 5 illustrates a rate-matching method based on puncturing/shortening according to embodiments of the disclosure.

Referring to FIG. 5, a rate-matching method based on puncturing/shortening for transmission of N=12 in the polar code of $N_0=16$ is illustrated. In the embodiment of the disclosure, $N_0=16$ and N=12, where $N_0>N$, so that $N-N_0=4$ bits may be punctured or shortened. In the embodiment of FIG. 5, it may be assumed that bits are punctured according to the bit order starting from the largest bit index of the x vector. However, this is only an example according to the embodiment of the disclosure, and it is possible to determine the positions of the bits to be punctured based on the actual channel performance according to the coding. In the rate matching of the embodiment of the disclosure, $(x_{15}, x_{14}, x_{13}, x_{12})$ 510 is punctured from $x=(x_0, x_1, \ldots, x_{15})$ obtained by the coding, thereby generating and generating codeword vector $(x_0, x_1, \ldots, x_{11})$.

Figure 6:
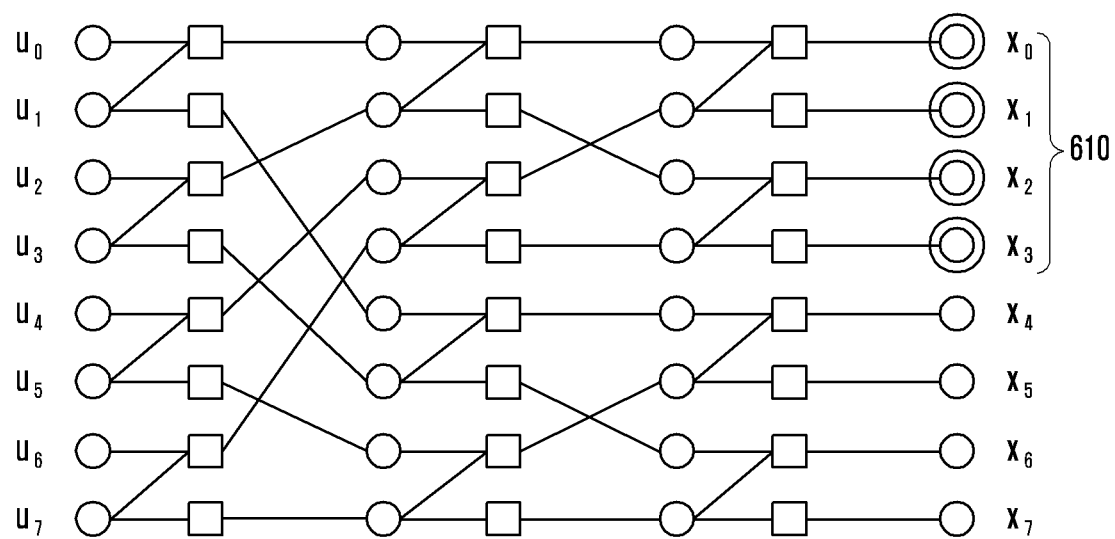
FIG. 6 is a diagram illustrating a repetition-based rate-matching method according to embodiments of the disclosure.

FIG. 6 is a diagram illustrating a repetition-based rate-matching method according to an embodiment of the disclosure.

Referring to FIG. 6, a repetition-based-rate-matching method for transmission of N=12 in the polar code of $N_0=8$ is illustrated. For example, FIG. 6 illustrates the repetition-based rate-matching method. In the embodiment of FIG. 6, $N_0=8$ and N=12, where $N_0<N$, so that $N-N_0=4$ bits may be repeatedly transmitted. In the embodiment of FIG. 6, it may be assumed that bits are repeatedly transmitted according to the bit order starting from the lowest bit index of the x vector. However, this is only an example according to the embodiment of the disclosure, and it is possible to determine the positions of the bits to be repeated based on the actual channel performance according to the coding. Therefore, in the rate-matching, $(x_0, x_1, x_2, x_3)$ 610 is repeated in $x=(x_0, x_1, \ldots, x_7)$ obtained from the coding, thereby generating and transmitting codeword vector $(x_0, x_1, \ldots, x_7, x_0, x_1, x_2, x_3)$.

The decoding the polar code may include a process of splitting a combined channel by the coding process. The channel polarization may be performed along with the channel split operation. Hereinafter, the features of the decoding will be described.

First, a log-likelihood ratio (LLR) value for each bit of the x vector passing through the channel W is calculated. If there are the punctured bits in the x vector, the LLR value of the positions of bits may be 0, and if there is the shortened bit, the LLR value of the position of the bit may be a preset specific value. In the embodiment of the disclosure, the preset specific value may be a large value, such as upper values among the LLR values that may be provided for each bit, which may be variously applied according to the embodiment.

If there are repeatedly transmitted bits in the x vector, the LLR value for each bit repeatedly transmitted may be added to be set to be the LLR value of the repeated bits. By this calculation, all the LLR values for each bit of the x vector having a length of No may be obtained and assigned to the rightmost variable node of FIGS. 2 and 3.

If the LLR value is set as described above, the decoding may proceed with a successive-cancellation (SC) operation. In the SC decoding process, the values for each bit of the x vector may be successively decoded one by one, and the bit determined after the decoding may be used to calculate the value of the bit to be subsequently decoded.

Using the LLR obtained from the channel, the LLR is calculated at $u_0$ through the SC. In this case, if $u_0$ is a frozen bit, the value is fixed to a preset value (for example, 0). Otherwise, the bit value may be determined based on the LLR value. When the value of bit $u_0$ is determined, the LLR of $u_1$ may be calculated based on the LLR obtained from the channel and the bit value of $u_0$. For example, the LLR value of $u_i$ may be calculated when given hard-decision values of the LLRs obtained from the channel and values from $u_0$ to $u_{i-1}$. This process successively proceeds until a value of $u_{N_0-1}$ is calculated.

If the input bit sequence b' generates a parity bit by the precoding operation during the process of coding the polar code, it should be reflected in the operation of decoding the polar code. During the decoding, if $u_0$ is a bit generated by a linear combination of bits in the input bit sequence, it determines whether the $u_0$ bit is 0 or 1 from the result of previously determined bits, which is reflected during the decoding.

Figure 7:
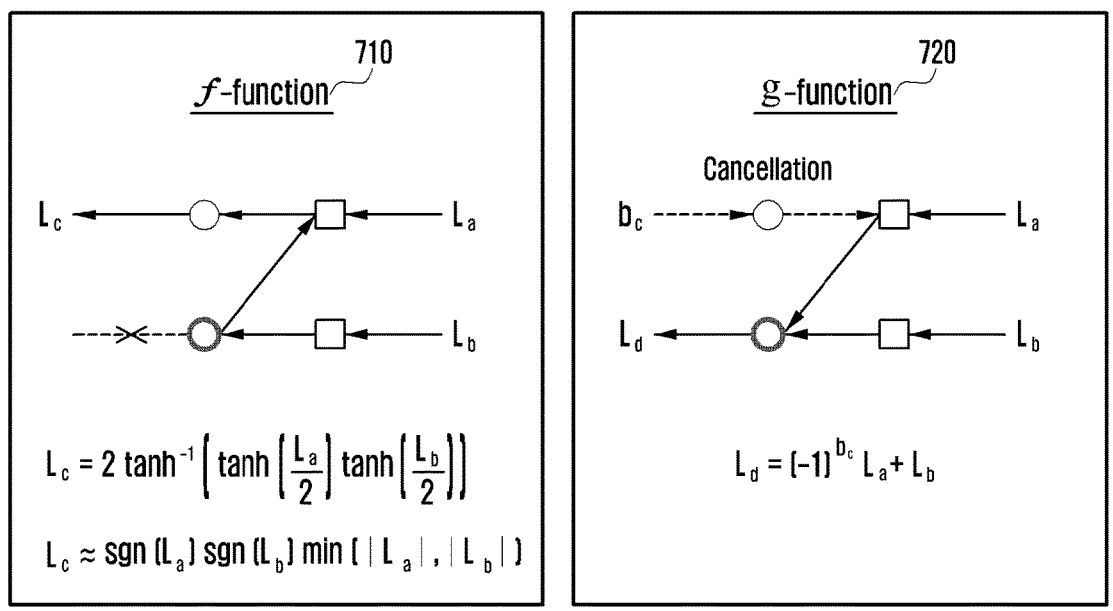
FIG. 7 illustrates a decoding method according to an embodiment of the disclosure.

FIG. 7 illustrates a decoding method according to an embodiment of the disclosure.

Referring to FIG. 7, an operation of a f-function 710 and a g-function 720 performed during the decoding is illustrated.

In the embodiment of the disclosure, in the SC decoding process, two types of operations are performed depending on the type of variable nodes. Like the basic components of FIG. 4 as described above, the operation of the f-function 710 may be performed in a single parity-check node and the operation of the g-function 720 may be performed in the repetition node.

If the bit value of any of the two variable node values of the basic components is not predicted or determined, the operation of the f-function 710 is performed to calculate the LLR value for the single parity check node. If the two LLR values input from the right side of the basic components are $L_a$ and $L_b$, respectively, in order from the above, an LLR value $L_c$ by the f-function 710 may be calculated as $L_c = 2 \tan h^{-1}(\tan h(L_a/2) \tan h(L_b/2))$. This operation may be computed by formula $L_c = \text{sgn}(L_a)\text{sgn}(L_b)\min(|L_a|, |L_b|)$ which is generally approximated by min-sum.

If the bit value for the single parity check node among the basic components is hard-decided to be predicted or determined, the LLR value for the repetition node may be calculated by the operation of the g-function 720. The two LLR values input from the right side of the basic components are assumed to be $L_a$ and $L_b$, respectively, in order from the top, and let the predicted or determined bit value of the single parity check node is assumed to $L_c$. At this time, the LLR value $L_d$ of the repetition node may be calculated by an operation $L_d = (-1)^{b_r} L_a + L_c$ of the g-function.

Referring to the decoding operation, in the SC decoding operation for the polar code having a length of No, the operation of the f-function 710 and the operation of the g-function 720 each may be performed $0.5 N_0 \log_c N_0$ times. These operations may be processed in $2N_0-2$ clock cycles. Therefore, the decoding complexity and delay may be determined proportionally by the size $N_0$ of the mother code used, not the number of information bits k or the number N of codeword bits.

Figure 8:
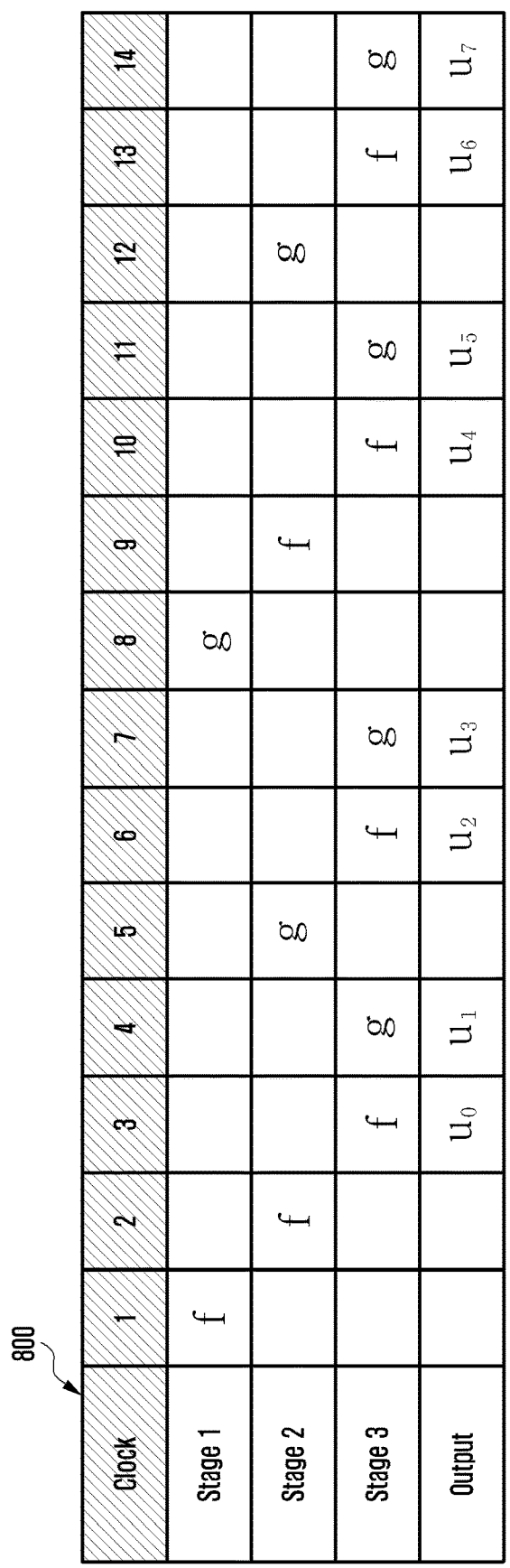
FIG. 8 is a diagram illustrating decoding scheduling using a polar code according to an embodiment of the disclosure.

FIG. 8 is a diagram illustrating decoding scheduling using a polar code according to an embodiment of the disclosure.

Referring to FIG. 8, the scheduling of the f-function 710 and the g-function 720 of the SC decoder implemented in the polar code of $N_0=8$ is illustrated. The function applied to each stage according to the clock cycle and the resultant values thereof are illustrated by reference numeral 800. First, after the operation of the f-function 710 (clock 1) is performed at one node whose value is not determined is selected from nodes of stage 1, the operation of the f-function 710 is performed at the node of the corresponding stage 2 (clock 2), and the operation of the f-function 710 is performed at the corresponding node of stage 3 (clock 3) to obtain the result value $u_0$. Thereafter, the operation of the f-function 710 and the operation of the g-function 720 are performed according to the clock cycle to obtain the resultant value.

As described in the subchannel allocator 103 of FIG. 1, the channel capacity or the reliability may be changed depending on the positions of the input bits. An absolute value and a relative value of other channel capacities depending on the positions of the bits are determined based on an average state (for example, a signal to noise ratio (SNR)) of the channel or the modulation order of the QAM modulation symbol used and the positions of the bits in the QAM symbol including the input bits.

Figure 9A:
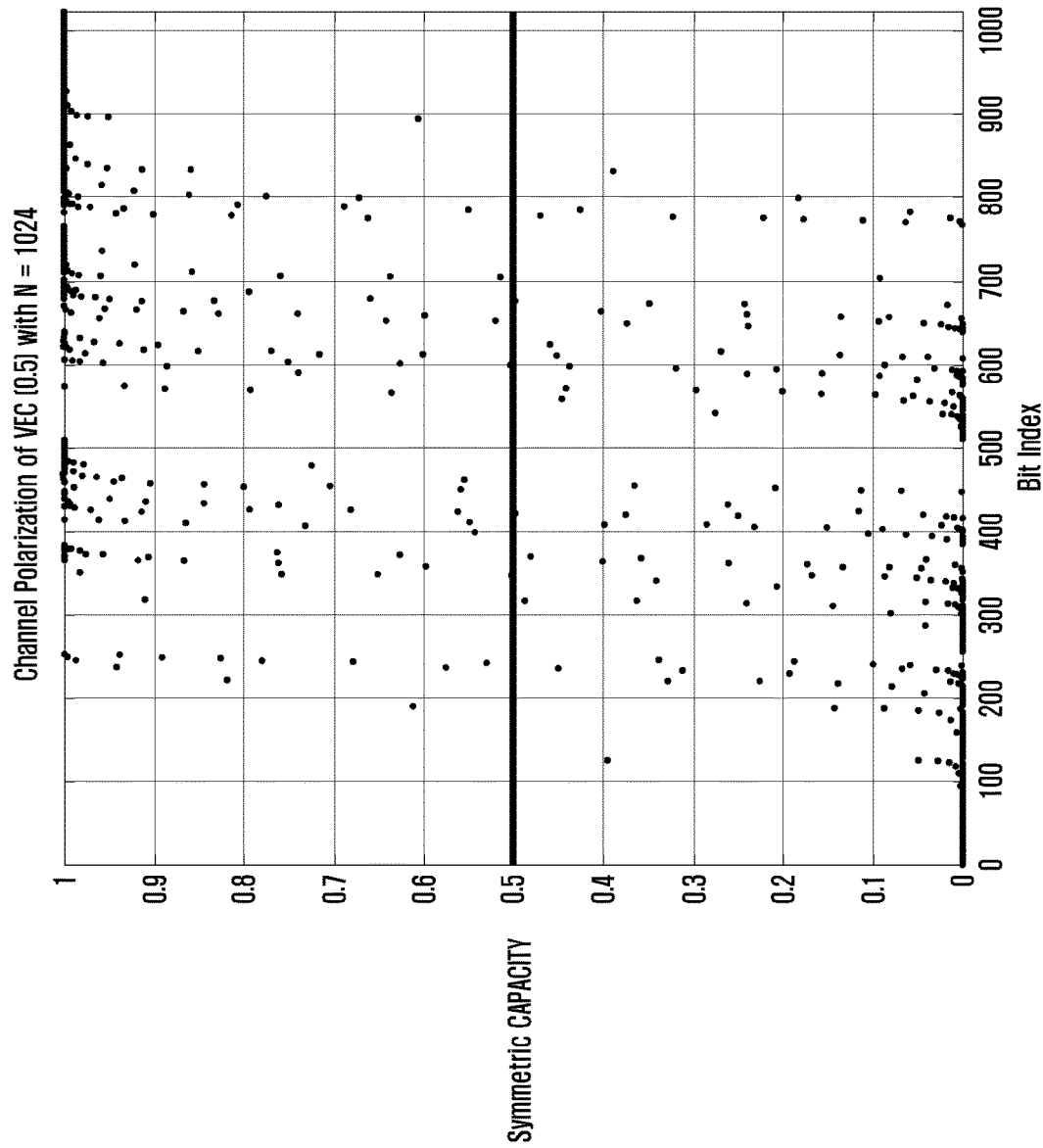
FIG. 9A is a diagram illustrating channel capacity by polarization when $N_0=2^{10}$ in BEC according to an embodiment of the disclosure.

FIG. 9A is a diagram illustrating channel capacity by polarization when $N_0=2^{10}$ in BEC according to an embodiment of the disclosure.

FIG. 9A illustrates the channel capacity for each position (index) of bits when $N_0=2^{10}$. Referring to FIG. 9A, it may be seen that the channel capacity differs according to the positions (index) of the input bits of each polar code. As a result, it may be seen that the coding performance gain is maximized when the information word bits among the input bits of the polar code are the index of the bit having the high channel capacity.

Figure 9B:
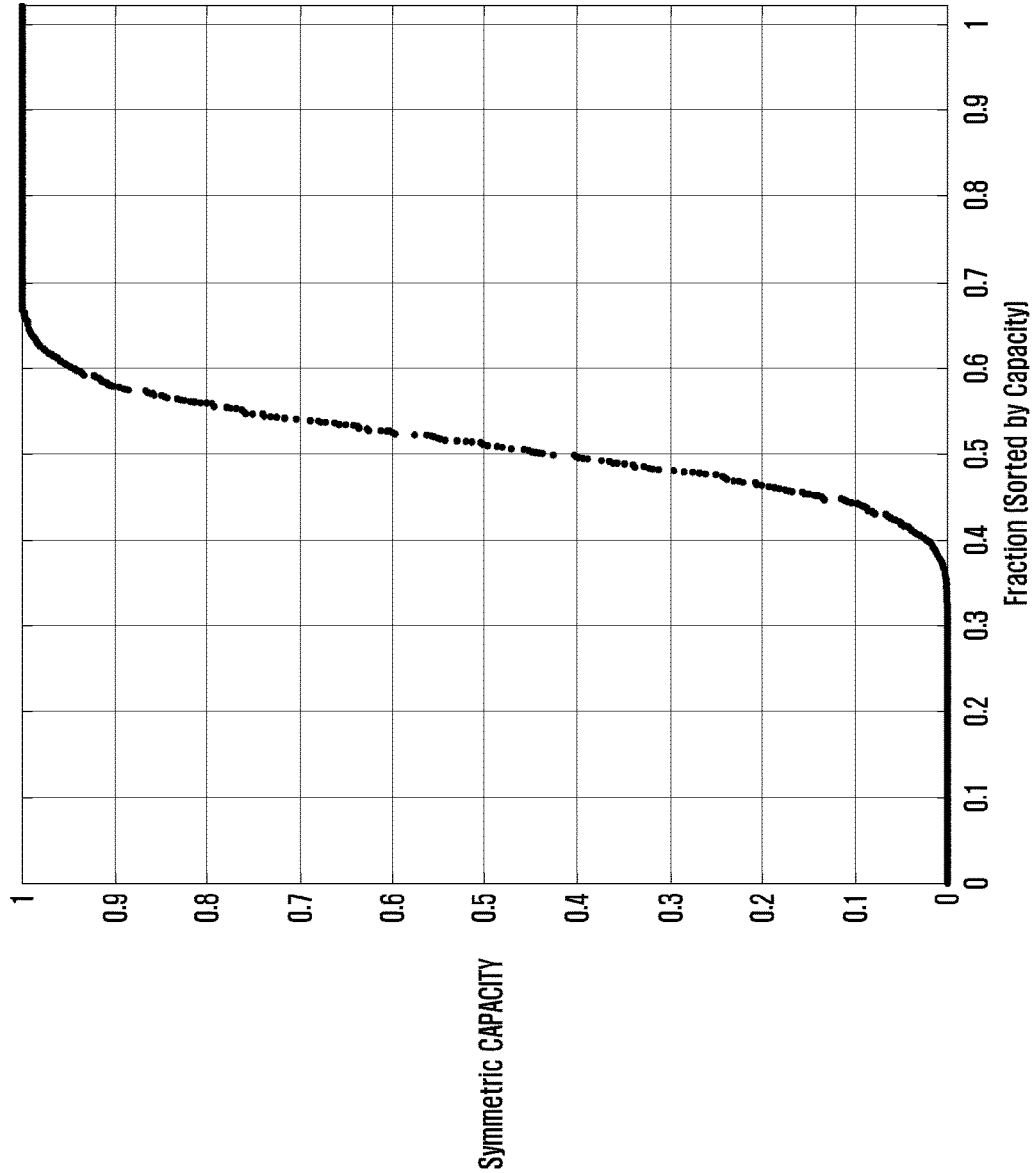
FIG. 9B is a diagram illustrating a channel capacity depending on a fraction after sorting a bit index according to the channel capacity of $N_0=2^{10}$ according to an embodiment of the disclosure.

FIG. 9B is a diagram illustrating a channel capacity depending on a fraction after sorting a bit index according to the channel capacity of $N_0=2^{10}$. It may be seen that in a BEC (0.5) channel, a fraction of bits having a channel capacity of 0.5 bits or less is 0.5, and a fraction of bits having a channel capacity of 0.5 bits or more is 0.5.

Referring to FIG. 9B, the channel capacity for each bit index is changed according to the channel type and the modulation scheme used. More particularly, when a high-order modulation scheme is used, the channel capacity for each bit index is greatly changed according to which positions of bits in the high-order modulation symbol each position of bits is mapped to.

Figure 10B:
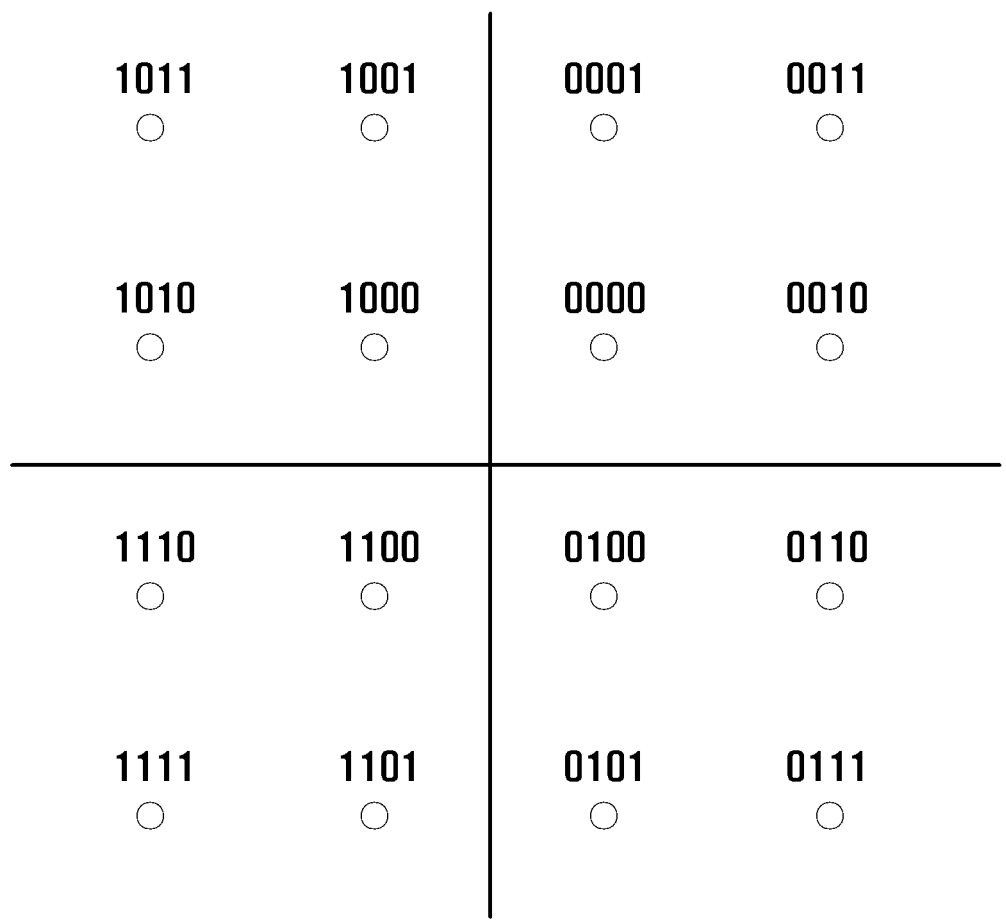

FIGS. 10A and 10B are diagrams of constellation and possible bit labeling of a gray-mapped 16-QAM modulation scheme according to an embodiment of the disclosure. This indicates the relationship between the codeword bit to be transmitted and the QAM symbols, and the value of the QAM symbols to be transmitted are determined according to the four code bit values.

Referring to FIGS. 10A and 10B, it is divided into a most significant bit (MSB) or a least significant bit (LSB) depending on positions of bits which indicate positions of constellations, and the bits allocated to the MSB has higher reliability than the bits allocated to the LSB.

If the polar code sequence designed on the assumption of binary phase shift keying (BPSK) (or quadrature phase shift keying (QPSK)) transmission is transmitted through a modulator in the high-order modulation scheme without any consideration, severe performance deterioration may occur. Therefore, in order to improve the performance of the polar code in the case of the transmission in the high-order modulation scheme, it is necessary to consider a mapping method of bits constituting the codeword bits and the high-order modulation symbol.

Figure 11:
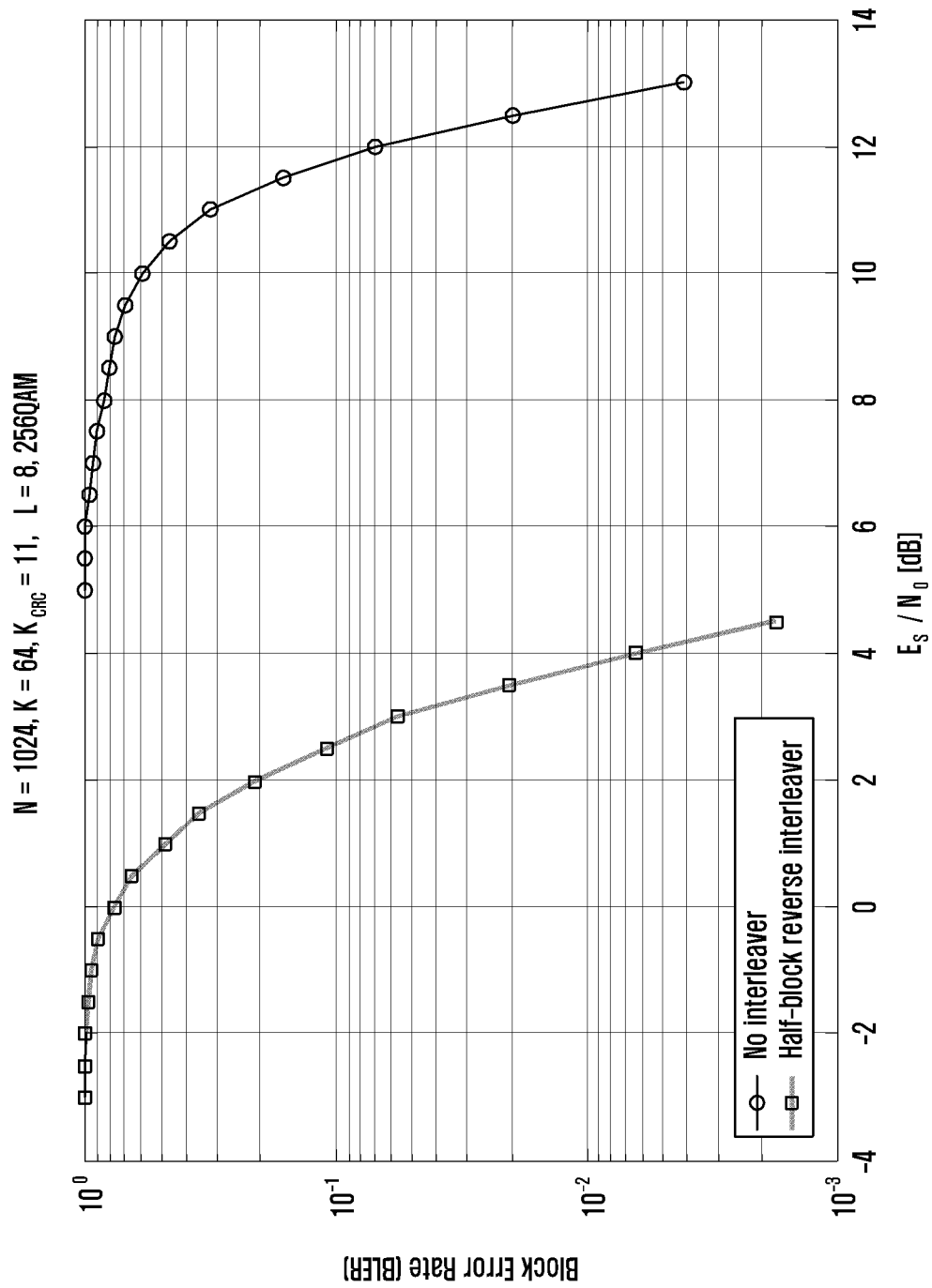
FIG. 11 is a graph illustrating block error rate (BLER) performance between a case in which interleaving considering a high-order modulation scheme is used and a case in which the interleaving is not used, based on an optimized polar code sequence under the assumption of binary phase shift keying (BPSK) (or quadrature phase shift keying (QPSK)) according to an embodiment of the disclosure.

FIG. 11 is a graph illustrating block error rate (BLER) performance between a case in which interleaving considering a high-order modulation scheme is used and a case in which the interleaving is not used, based on an optimized polar code sequence under the assumption of BPSK (or QPSK) according to an embodiment of the disclosure.

Referring to FIG. 11, when the interleaving considering the high-order modulation scheme is used, move excellent BLER performance may be obtained, as compared to when the interleaving is not used. In addition, when designing the interleaving considering the high-order modulation scheme as illustrated in FIG. 11, it is necessary to consider that the reliability is changed depending on the positions of the bits constituting the QAM symbol to be used.

Figure 12:
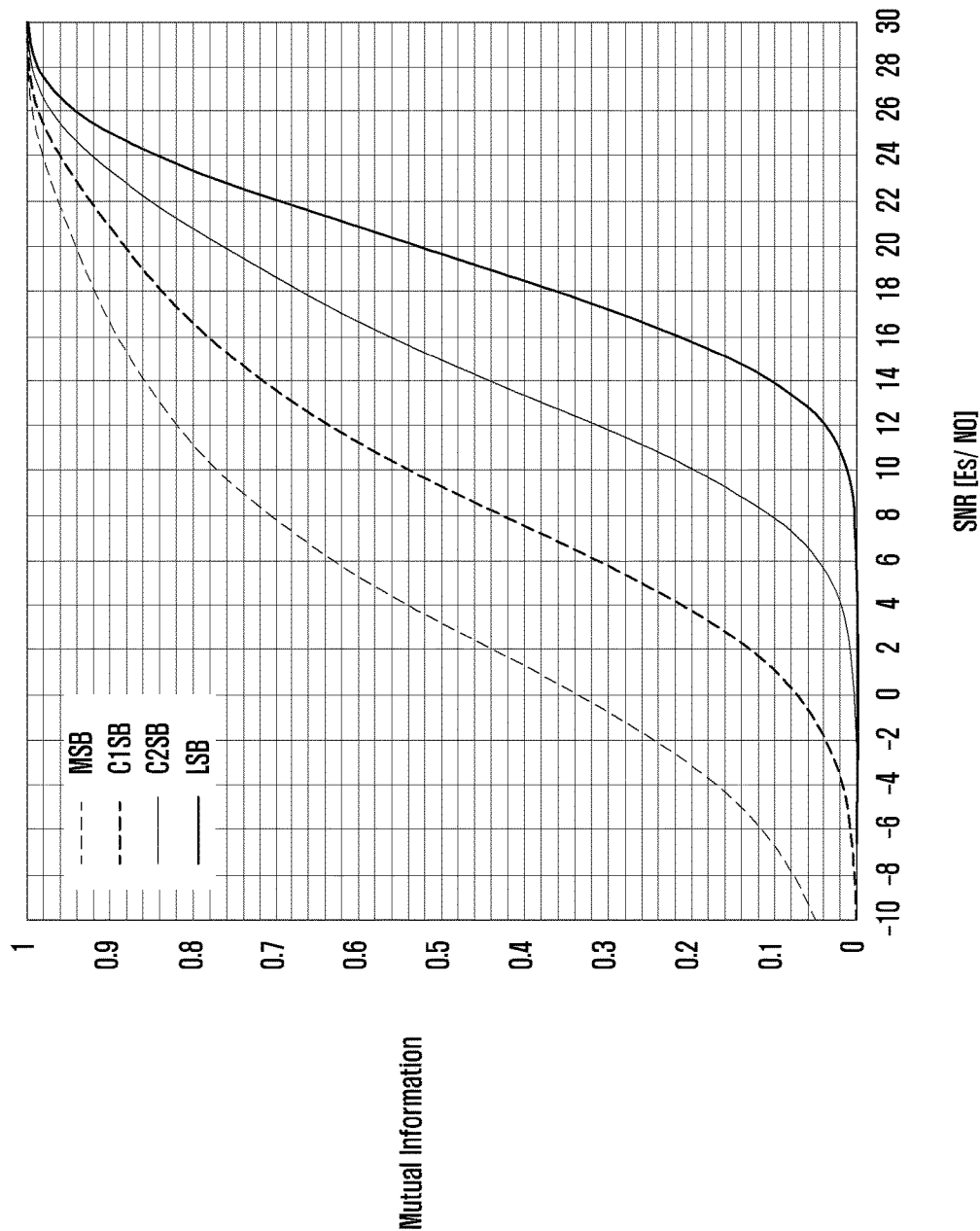
FIG. 12 is a graph illustrating mutual information (MI) of reliability for each bit when 256-QAM is used according to an embodiment of the disclosure.

FIG. 12 is a graph illustrating mutual information (MI) of reliability for each bit when 256-QAM is used according to an embodiment of the disclosure.

Referring to FIG. 12, a 256-QAM symbol consists of 8 bits $b_0$, $b_1$, $b_2$, $b_3$, $b_4$, $b_5$, $b_6$, and $b_7$. The front four bits $b_0$, $b_1$, $b_2$, and $b_3$ in the 256-QAM symbols constitute an I-channel which is a real part and the following four bits $b_4$, $b_5$, $b_6$, and $b_7$ in the 256-constitutes a Q channel which is an imaginary part. It is assumed that the bits $b_0$, $b_1$, $b_2$, and $b_3$ constituting the I channel are denoted by MSB, C1SB, C2SB, and LSB, respectively. In addition, as illustrated in FIG. 12, it may be seen that mutual information greatly differs depending on four positions of bits constituting the real part (or imaginary part) of 256-QAM at the same SNR (MSB>C1SB>C2SB>LSB). Therefore, it is necessary to design an interleaver for performing the interleaving considering the reliability of bits constituting the high-order modulation symbols.

Since the design of the interleaver is required in the case of constituting the high-order modulation symbols, the contents of the interleaver will be described below.

According to the embodiment of the disclosure, the interleaver which is used to transmit polar coded bits coded based on an arbitrary polar code sequence in the high-order modulation symbol may be designed based on the following rules.

Rule 1) An interleaver is designed to generate a target partial sequence in a short length. Here, the design of the interleaver includes the meaning of a design for bits-to-symbol mapping.

Rule 2) When the polar code bits using a mother matrix longer than a mother matrix having a pre-designed length are transmitted, the designed bits-to-symbol mapping is repeated. For example, the mapping order is nested with respect to the length of the mother matrix. In other words, a long length may include a short length.

The detailed description of the design rule 1) of the interleaver is as follows. The unit length for designing the interleaver, that is, the bits-to-symbol mapping designed in correspondence with the length of the target partial sequence is $2^n$ (power of 2), where n is a natural number, $2^n$ is equal to larger than the number of bits included in the QAM symbol.

The target partial sequence and the designed bits-to-symbol mapping will be described with reference to FIG. 13.

Figure 13A:
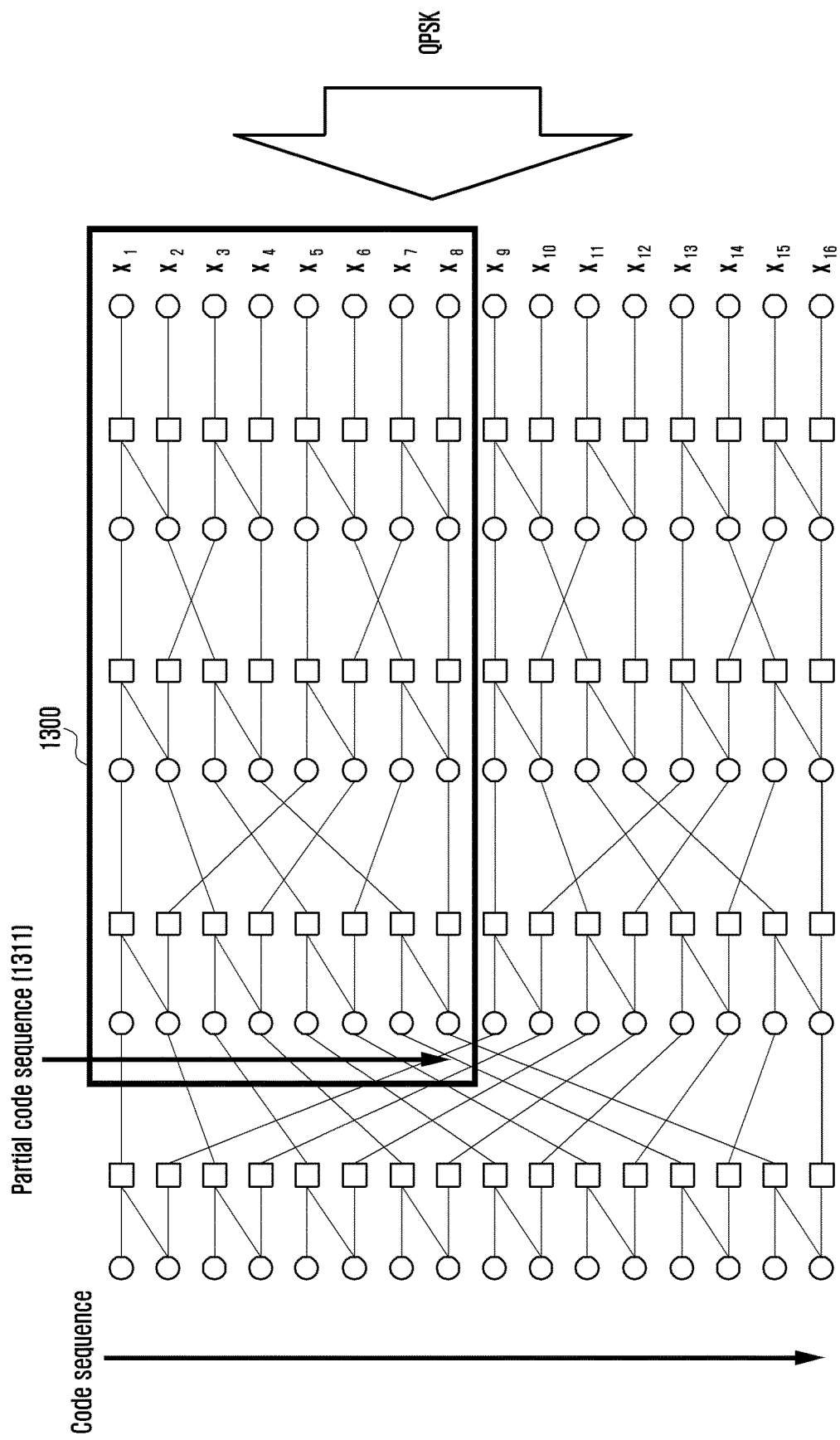
FIGS. 13A, 13B, and 13C are diagrams illustrating a case in which a length of the polar code structure of FIG. 2 described above is 16, and is a diagram illustrating finding a good subchannel order under the assumption of QPSK transmission by designing a polar code sequence under the assumption of QPSK according to an embodiment of the disclosure.
Figure 13B:
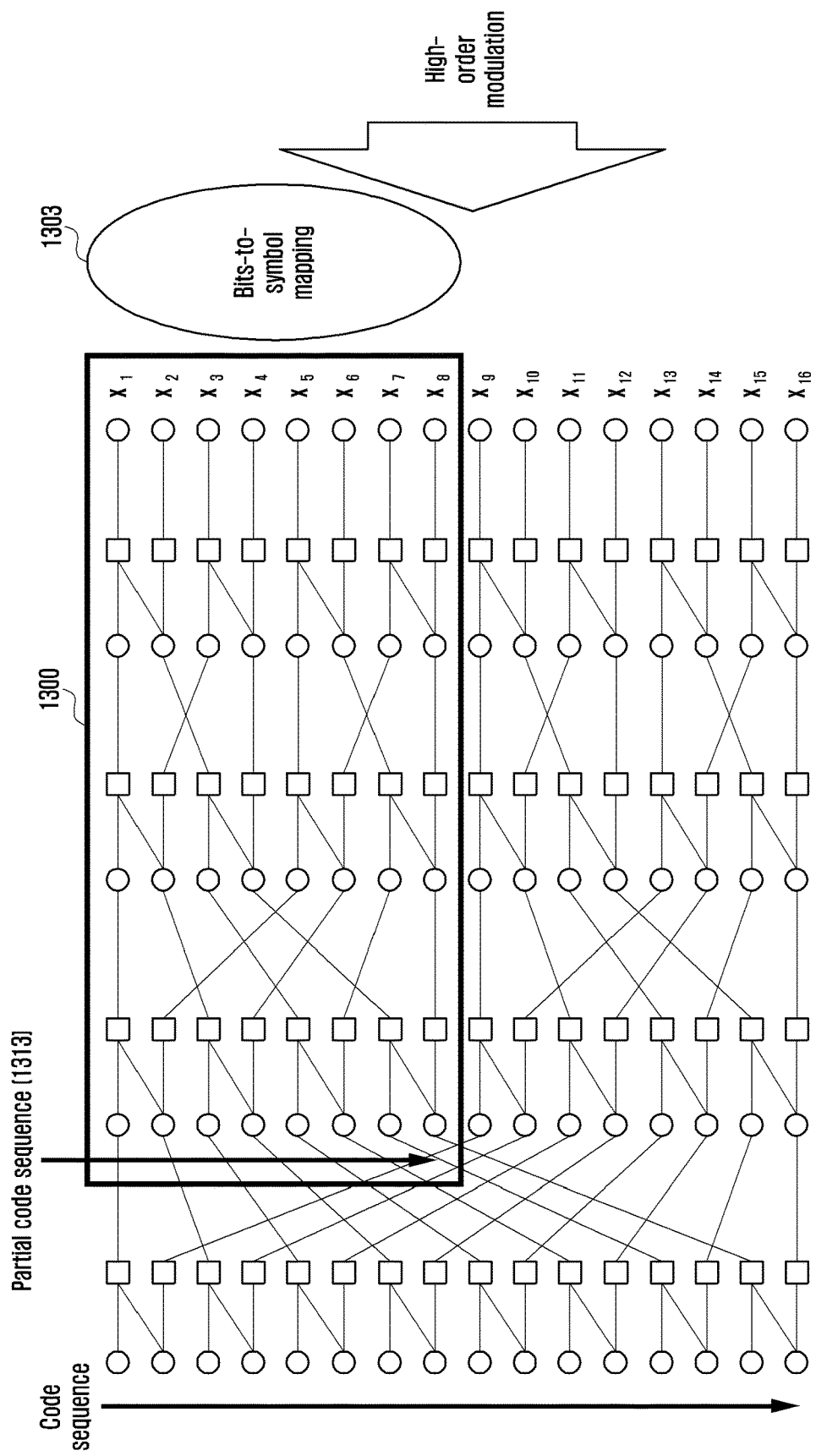
Figure 13C:
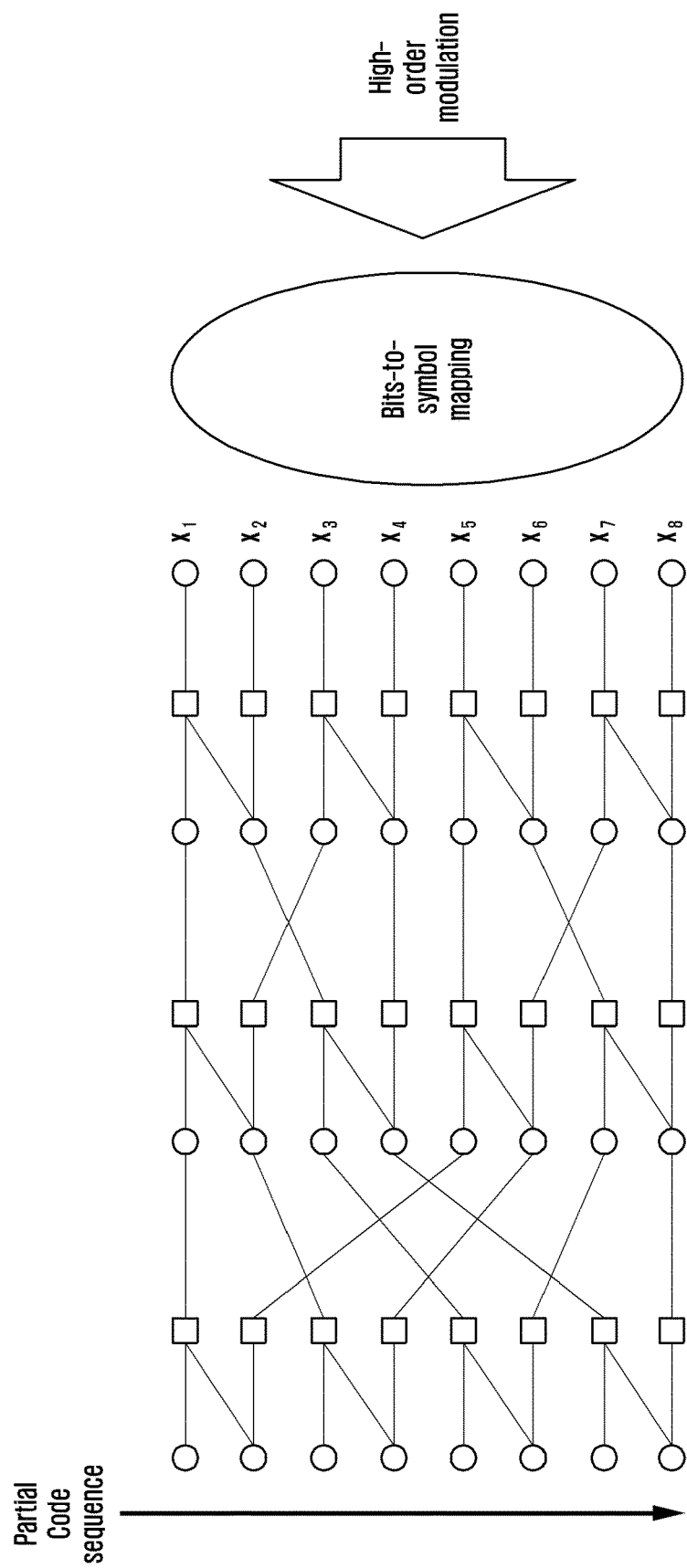

FIGS. 13A, 13B, and 13C are diagrams illustrating a case in which a length of the polar code structure of FIG. 2 described above is 16, and is a diagram illustrates finding a good subchannel order under the assumption of QPSK transmission by designing a polar code sequence under the assumption of QPSK according to an embodiment of the disclosure.

Referring to 13A, 13B, and 13C, a code sequence of a polar code having a length of 8 may be an example of a partial code sequence, and a code sequence having a length of 8 and a code sequence having a length of 16 have a nested relationship. In other words, a code sequence having a length of 8 is included in a code sequence having a length of 16 and may be extracted directly from a code sequence having a length of 16. For example, if the length of the polar code structure illustrated in FIG. 13A is 16, a code sequence having eight lengths may be successively used as a direction indicated by reference numeral 1311.

Using this property, under the assumption of the higher-order modulation scheme, it is possible to design the bit-to-symbol mapping 1303 which generates a polar code sequence 1313 which is the same or as close as possible to a polar code sequence 1311 having a relatively short length which is designed in QPSK. This is illustrated more simply in FIG. 13C. FIG. 13C may be included in FIG. 13B, and may correspond to 1300 of FIG. 13B.

Therefore, after designing the bit-to-symbol mapping (i.e., an interleaver) to be mapped to the higher-order modulation symbol based on FIG. 13C, it is necessary to design the interleaver which may repeatedly have the same bits-to-symbol mapping to support the long-length polar code. In this case, the bit-to-symbol mapping that achieves the target partial sequence may not be unique. Therefore, when supporting the long-length polar code, the same bits-to-symbol mapping may be used repeatedly, and at least two different types of bits-to-symbol mapping may be used. Summarizing the above description, as illustrated in FIGS. 13A, 13B, and 13C, the polar codes may be configured so that a small-sized graph may be included in a large-sized graph. Therefore, according to the disclosure, the bits-to-symbol mapping method for the short-length polar code based on a small-sized graph may be used, and may be applied to a long length according to a predetermined rule. As an example, the high-order modulation mapping is designed so that the polar code sequence designed based on an input channel distribution under the assumption of the use of a high-order modulation scheme at a small 16×16 length is similar to a specific polar code sequence. The main example of a specific polar code sequence at this time is the polar code sequence designed on the assumption of the QPSK. The following stages illustrate one example of designing the bits-to-symbol mapping considering the high-order modulation symbols.

Stage 1) Find the mutual information for each bit position for each SNR in a specific channel, for example, an additive white Gaussian noise (AWGN) channel. In this case, in the case of Gray-mapped 256-QAM, there are four bit positions with different reliability, which is referred to as MSB/C1SB/C2SB/LSB.

Stage 2) When the code bits of the polar code having a length of 16 use arbitrary bits-to-symbol mapping, the mutual information for each subchannel at the input end through processes, such as density evolution or Gaussian approximation may be calculated.

Stage 3) For each possible bit-to-symbol mapping, the mutual information for each bit position obtained in stage 1) is substituted to obtain the mutual information for each subchannel using stage 2), thereby comparing between the polar code sequence and the target code sequence. The mapping which is equal to the target code sequence or has the smallest difference from the target code sequence is selected from all the possible mappings.

In stage 3), although the index difference between the target code sequence and the target code sequence is compared, various metrics, such as the relative error probability between the subchannels targeted by extending the target code sequence and the relative error probability between the subchannels t the time of using the specific mapping may be used to compare with the similarity to the target code sequence. If the sub-block size is 16 based on the above-described stages, for example, a method for mapping to a 256-QAM symbol will be described as follows. First, the reliability for each position in the following description has features of MSB>C1SB>C2SB>LSB. For example, if the length is 16, the bits-to-symbol mapping that generates the target code sequence is as follows:

{MSB, C2SB, LSB, C1SB, C1SB, LSB, LSB, MSB, LSB, C2SB, C2SB, C1SB, MSB, MSB, C1SB, C2SB}. This form is as illustrated in FIG. 14.

Figure 14:
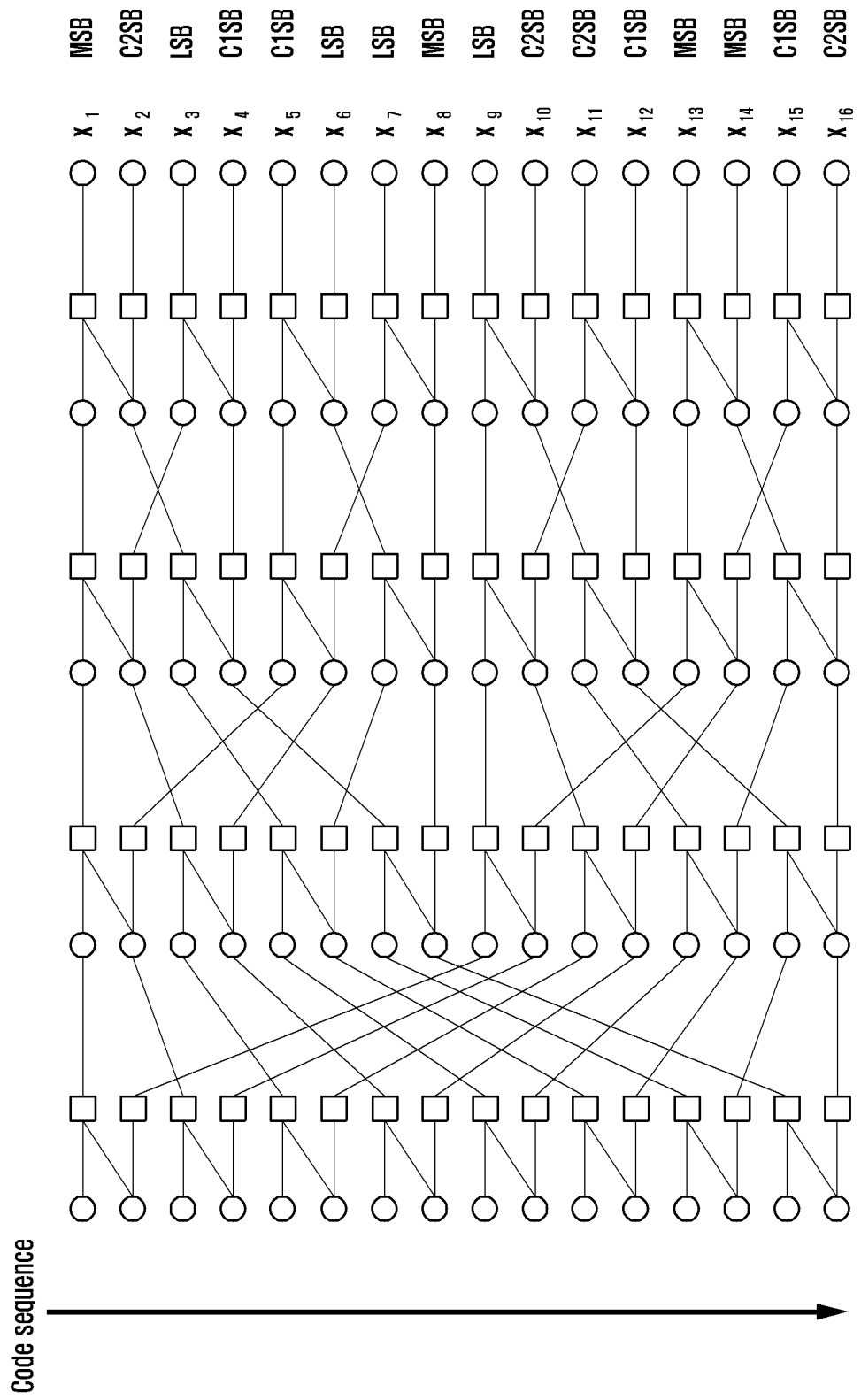
FIG. 14 is a diagram illustrating a bits-to-symbol mapping form for generating a target sequence code when a length is 16 according to an embodiment of the disclosure.

FIG. 14 is a diagram illustrating a bits-to-symbol mapping form for generating a target sequence code when a length is 16 according to an embodiment of the disclosure.

Referring to FIG. 14, in the following, i is $0 \leq i \leq N_0/16$ as a value related to the index of the polar code output sequence x.

TABLE 1

| $x_{16*i}$ | $x_{16*i+1}$ | $x_{16*i+2}$ | $x_{16*i+3}$ | $x_{16*i+4}$ | $x_{16*i+5}$ | $x_{16*i+6}$ | $x_{16*i+7}$ |
|---|---|---|---|---|---|---|---|
| MSB | C2SB | LSB | C1SB | C1SB | LSB | LSB | MSB |

| $x_{16*i+8}$ | $x_{16*i+9}$ | $x_{16*i+10}$ | $x_{16*i+11}$ | $x_{16*i+12}$ | $x_{16*i+13}$ | $x_{16*i+14}$ | $x_{16*i+15}$ |
|---|---|---|---|---|---|---|---|
| LSB | C2SB | C2SB | C1SB | MSB | MSB | C1SB | C1SB |

In an embodiment of the disclosure, the code bits stored in the buffer are successively input to the modulator, so that the mapping to MSB/C1SB/C2SB/LSB is determined depending on the position stored in the buffer. Under the assumption of the Gray-mapped labeling as illustrated in FIG. 10A, upon the use of the 256-QAM, the position 4*j stored in the buffer is MSB, 4*j+1 is C1SB, 4*j+2 is C2SB, and 4*j+3 is mapped to the LSB (j=0, 1, 2, ... ). Therefore, one type of interleaver having the bits-to-symbol mapping is {0, 3, 1, 2, 7, 4, 9, 5, 12, 11, 10, 6, 13, 14, 15, 8}. The meaning of the above pattern means that 0/3/1/2-th code bits are stored at 0/1/2/3-th positions of the buffer, respectively. Even when the length is 16, since there are four positions corresponding to the MSB, the interleaver pattern exemplified above is not unique.

In designing the interleaver based on the determined bits-to-symbol mapping, consideration is given to the puncturing/shortening/repeating order or the like in the group in addition to the reliability depending on the positions of the bits, property of spacing bits in the QAM symbol as far as possible in consideration of a fading channel or the like may be additionally considered.

A method of additionally considering property of spacing bits in the QAM symbol as far as possible in consideration of a fading channel or the like and mapping to a 256-QAM symbol when a sub-block size is 8 will be described as follows.

Hereinafter, it has the feature of MSB>C1SB>C2SB>LSB. For example, if the length is 8, the bits-to-symbol mapping that generates the target code sequence is as follows:

{C2SB, LSB, C1SB, MSB, MSB, C2SB, LSB, C1SB}.

In the following, i is $0 > i > N_0/8$ as a value related to the index of the polar code output sequence y. Therefore, values of {C2SB, LSB, C1SB, MSB, MSB, C2SB, LSB, C1SB} may be mapped as the following Table 2.

TABLE 2

| $x_{8*i}$ | $x_{8*i+1}$ | $x_{8*i+2}$ | $x_{8*i+3}$ | $x_{8*i+4}$ | $x_{8*i+5}$ | $x_{8*i+6}$ | $x_{8*i+7}$ |
|---|---|---|---|---|---|---|---|
| C2SB | LSB | C1SB | MSB | MSB | C2SB | LSB | C1SB |

Figure 15:
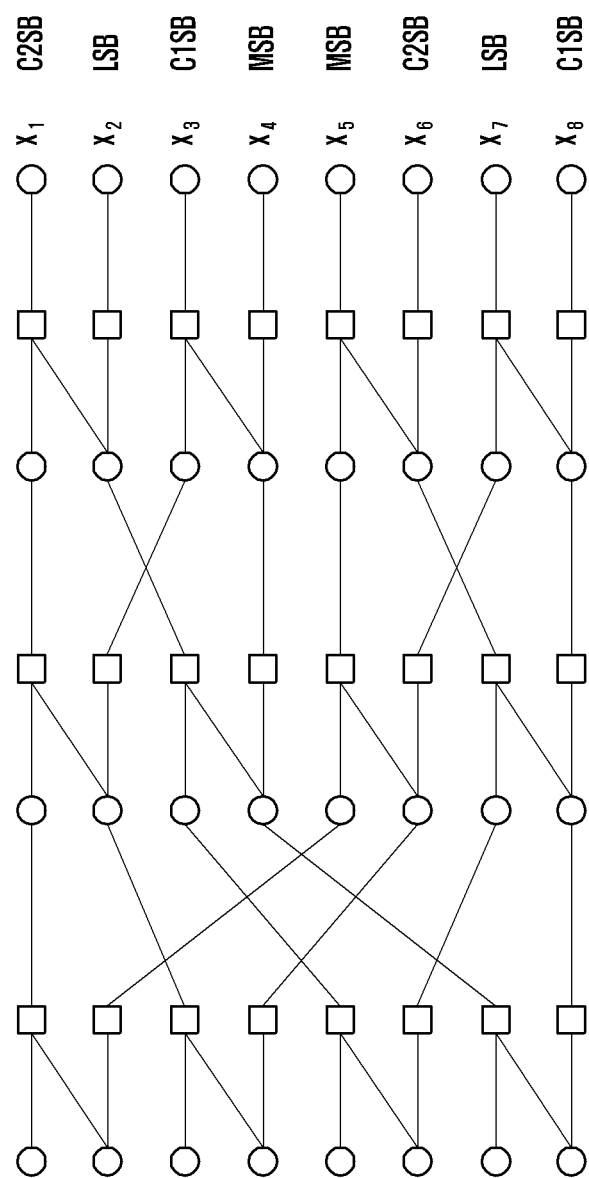
FIG. 15 is a diagram illustrating a bits-to-symbol mapping form for generating a target sequence code when a length is 8 according to an embodiment of the disclosure.

The contents of Table 2 may be expressed again as shown in FIG. 15.

FIG. 15 is a diagram illustrating a bits-to-symbol mapping form for generating a target sequence code when a length is 8 according to an embodiment of the disclosure. Similarly, one type of the interleaver having the bits-to-symbol mapping is {3, 2, 0, 1, 4, 7, 5, 6}.

Figure 16A:
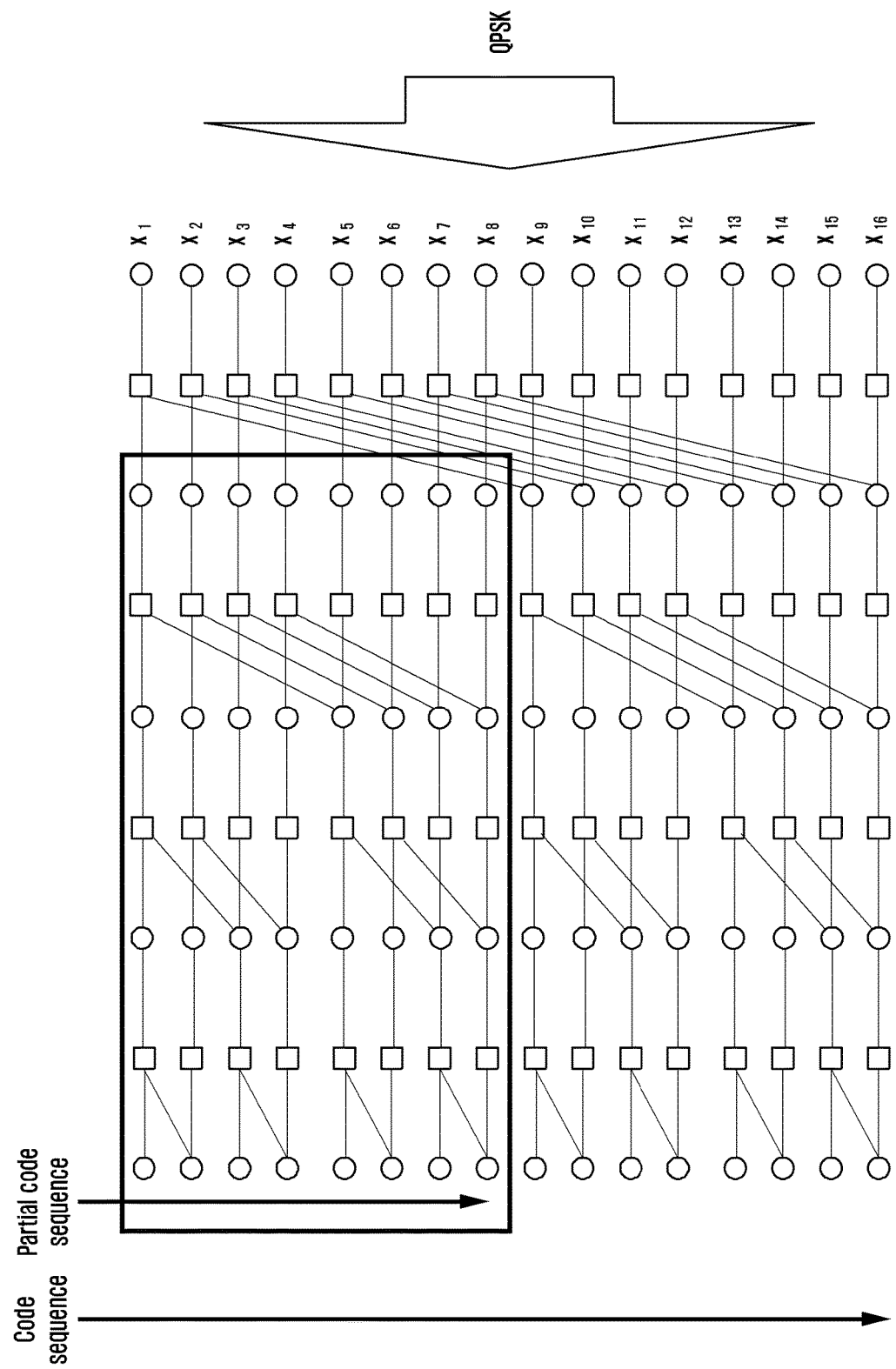
FIGS. 16A, 16B, and 16C are a polar code structure diagrams corresponding to FIGS. 13A, 13B, and 13C, respectively, based on the polar code structure of FIG. 3 according to an embodiment of the disclosure.
Figure 16B:
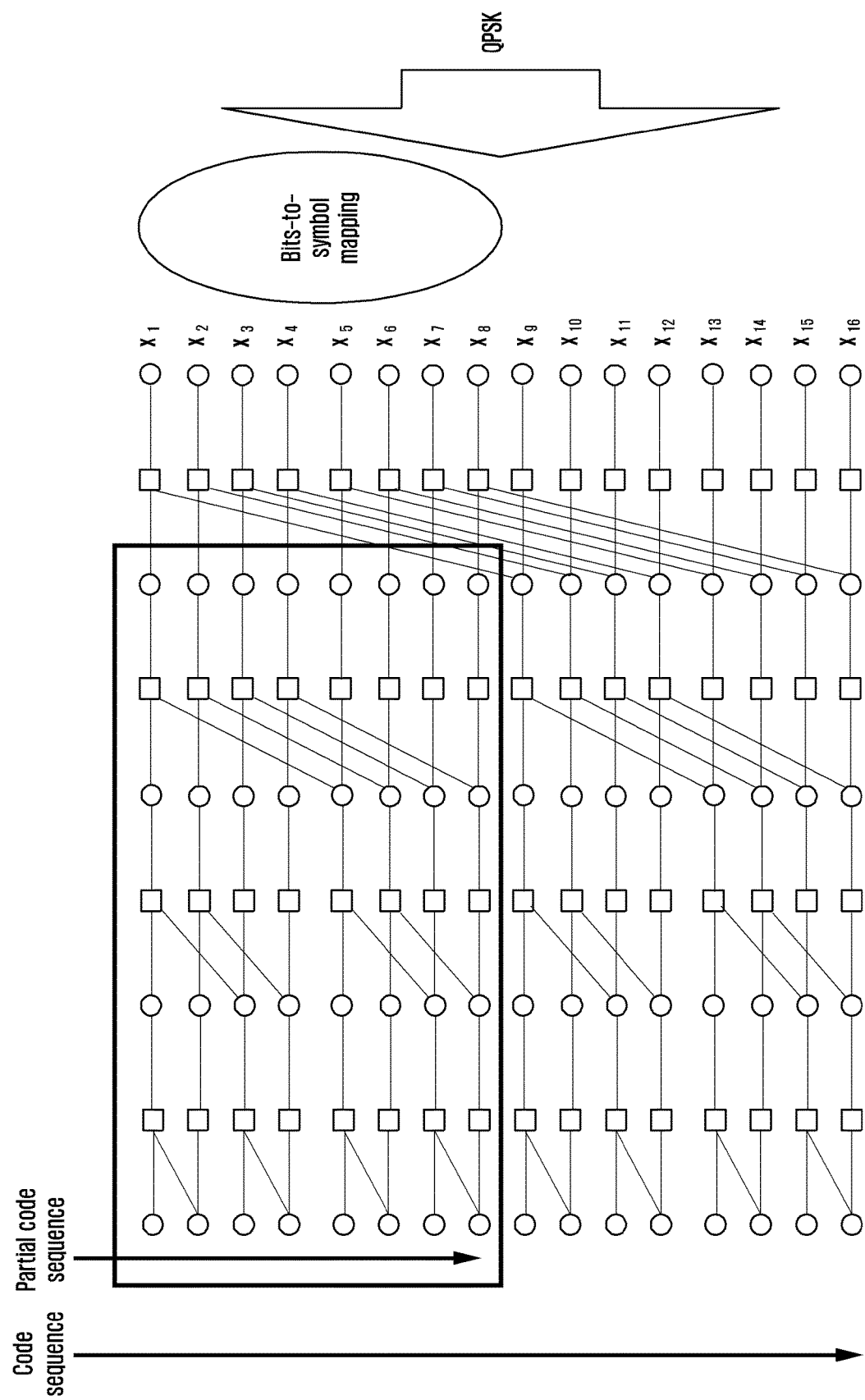
Figure 16C:
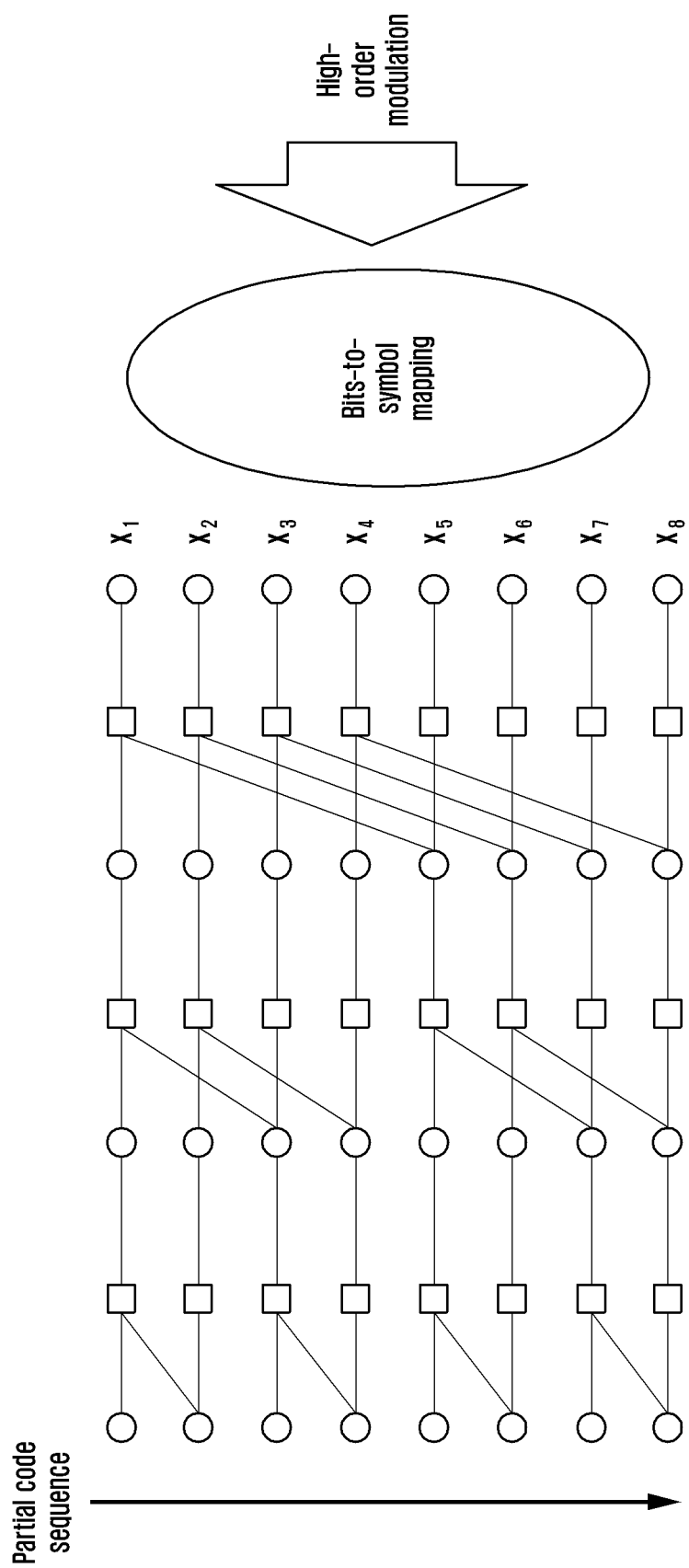

Referring to FIG. 15, the process of designing the small-length bits-to-symbol mapping is described in the polar code structure based on FIG. 2 as described above. As another example, FIG. 16 schematically illustrates the polar code structure based on FIG. 3. FIGS. 16A, 16B and 16C correspond to FIGS. 13A, 13B and 13C, respectively. Therefore, FIGS. 16A to 16C are a polar code structure diagrams corresponding to FIGS. 13A to 13C, respectively, based on the polar code structure of FIG. 3.

Even when the code bits coded with the polar codes are transmitted in the high-order modulation, some of the code bits may be punctured, shortened, or repeated for code rate/length adaptation (rate matching) of codes. Therefore, according to the embodiments described above, a design considering a case where some of the code bits are punctured/shortened/repeated is required. Serious performance losses occur if this is not taken into consideration.

In an embodiment of the disclosure, a method in which data are coded using a polar code and transmitted, received by a receiver and decoded is disclosed. More particularly, a transmission method considering both the high-order modulation scheme and the rate-matching scheme is considered. In addition, a method of performing demapping or deinterleaving in this manner may be included.

In the following embodiments of the disclosure, a mapping or interleaving method is defined. There are two typical orders for puncturing/shortening/repeating in a polar code.

Figure 17A:
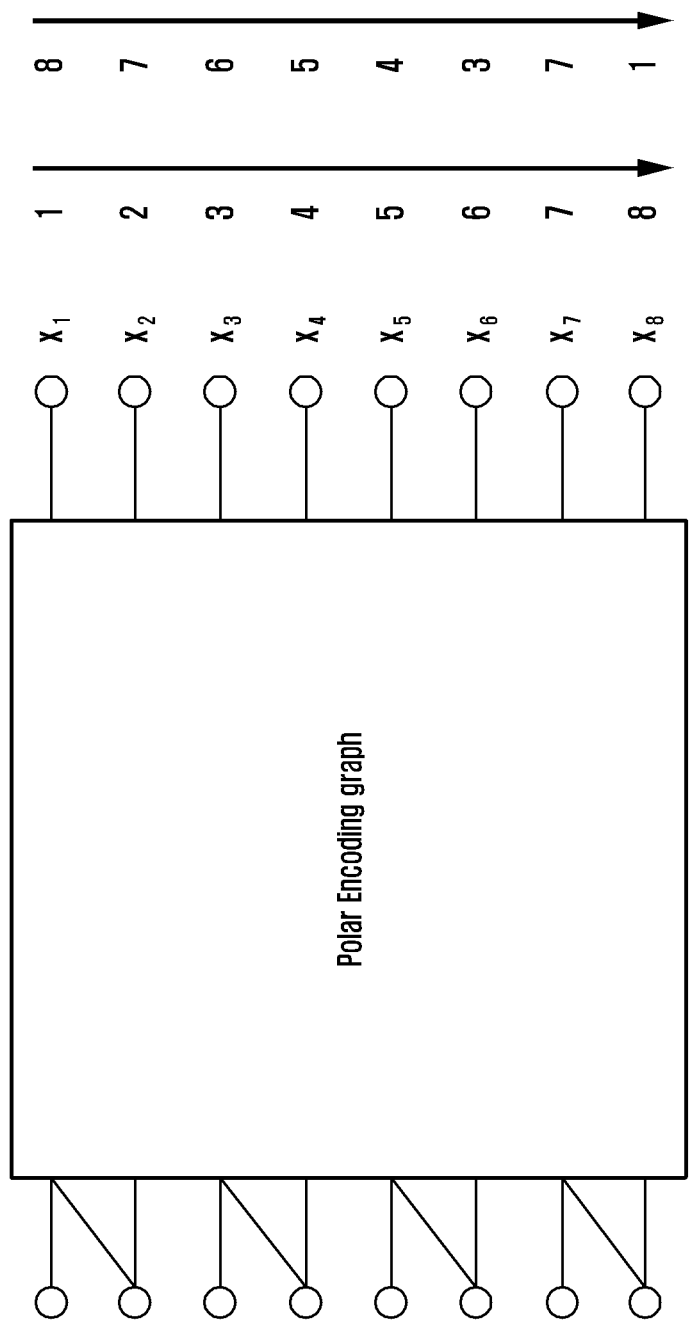
FIG. 17A is a schematic diagram of a sequential order for puncturing/shortening/repeating in a polar code according to an embodiment of the disclosure.

Sequence 1) Sequential order (puncturing/shortening/repeating of bits in order): This is the order of puncturing/shortening/repeating the code bits of the polar code in order from the top or bottom, which may be the order as illustrated in FIG. 17A. FIG. 17A is a schematic diagram of a sequential order for puncturing/shortening/repeating in a polar code.

Sequence 2) Bit-reversal order (puncturing/shortening/repeating in bit-reversal order): This is the bit-reversal order among the code bits of the polar code or the order of puncturing/shortening/repeating the code bits of the polar code in the reverse order thereto, which is the same as FIG. 17B.

Figure 17B:
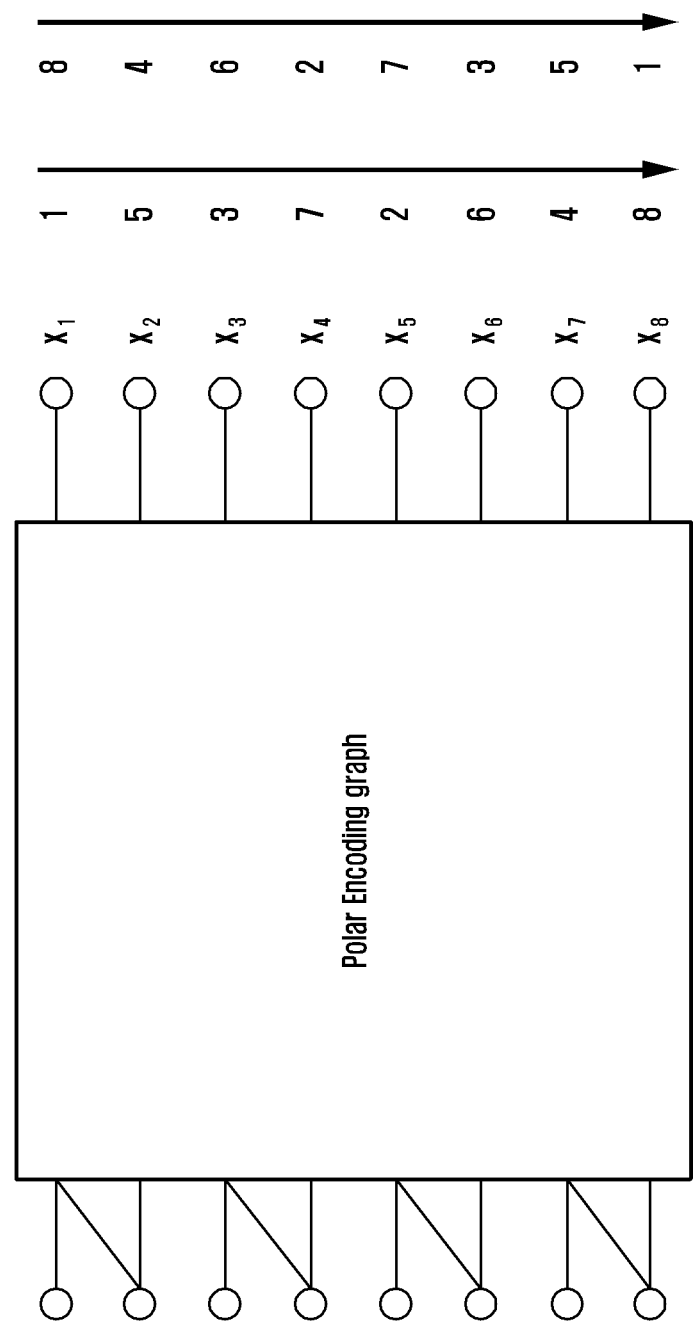
FIG. 17B is a schematic diagram of a bit-reversal order for puncturing/shortening/repeating in a polar code according to an embodiment of the disclosure.

FIG. 17B is a schematic diagram of a bit-reversal order for puncturing/shortening/repeating in a polar code according to an embodiment of the disclosure.

The bit-reversal order represents a sequence of code bit index in order from 0 as binary bits, and then a bit reversal order is represented.

Figure 18A:
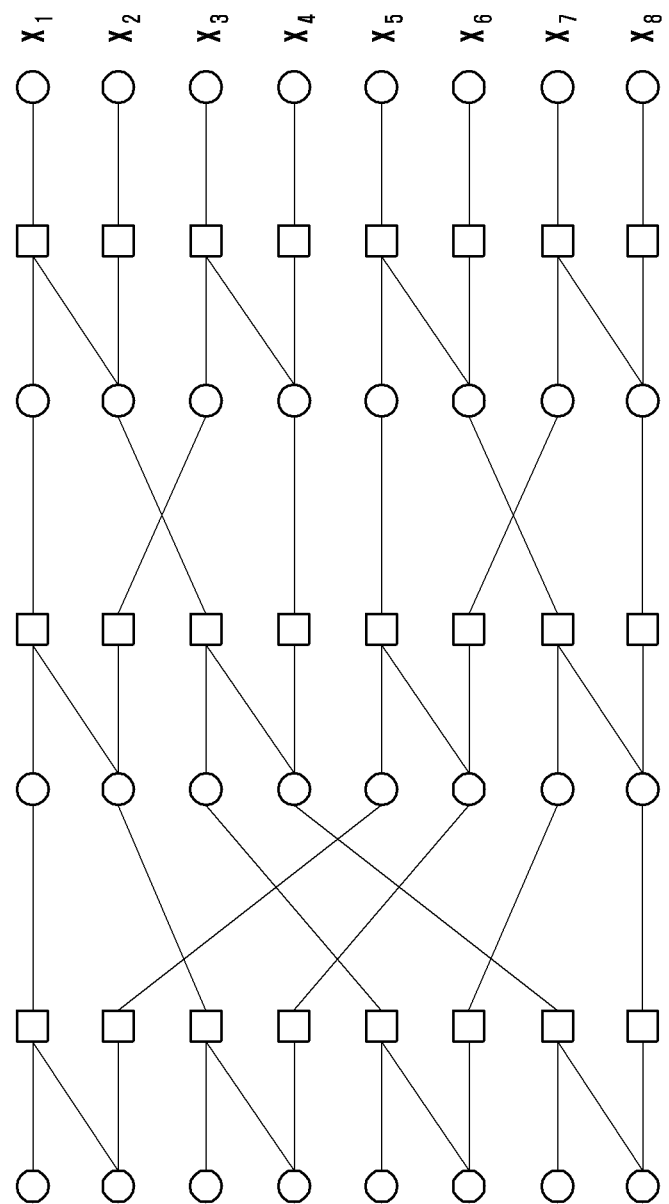
FIGS. 18A and 18B each are diagrams corresponding to the polar encoding graphs in FIGS. 17A and 17B according to an embodiment of the disclosure.
Figure 18B:
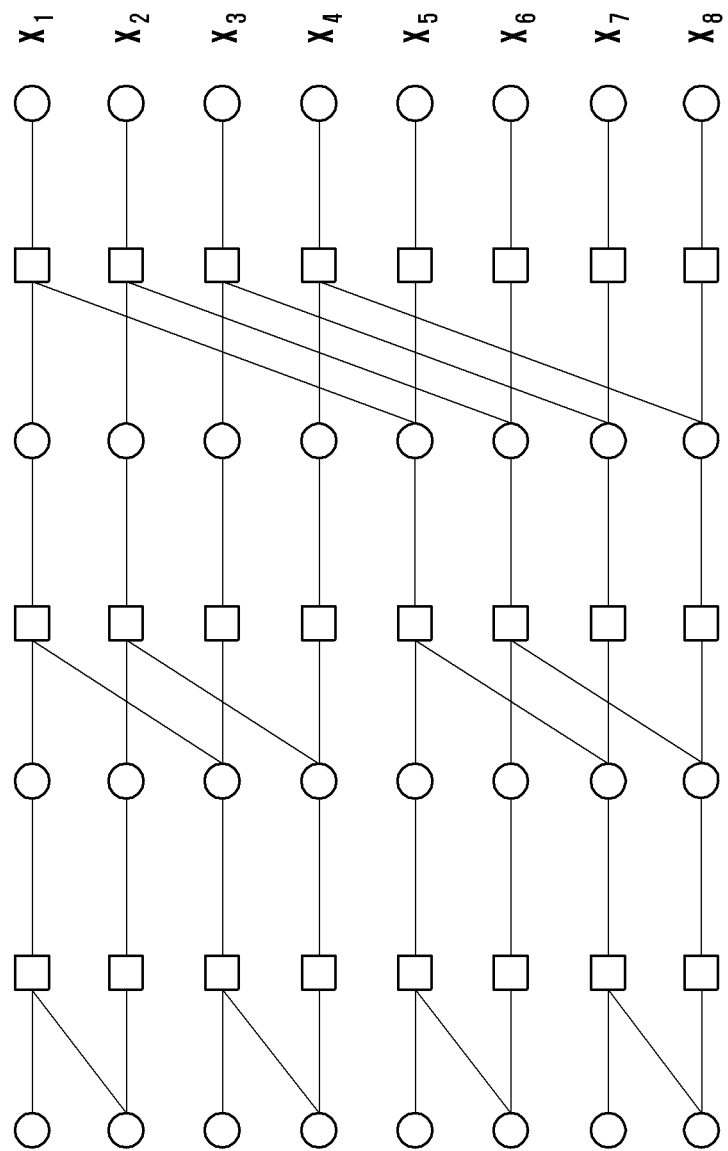

Referring to FIGS. 17A and 17B, the Polar Encoding Graph is available in two forms as illustrated in FIGS. 18A and 18B. For example, FIGS. 18A and 18B correspond to Polar Encoding Graphs in FIGS. 17A and 17B, respectively.

Hereinafter, a case will be described in which the interleaver described in the embodiment of the disclosure and the puncturing/shortening/repeating sequence 1) and the sequence 2) of the polar code described above are combined.

In the following description, the above-described sequence 1) and sequence 2) will be referred to as a sequential sequence and a bit-reversal sequence, respectively.

Figure 19:
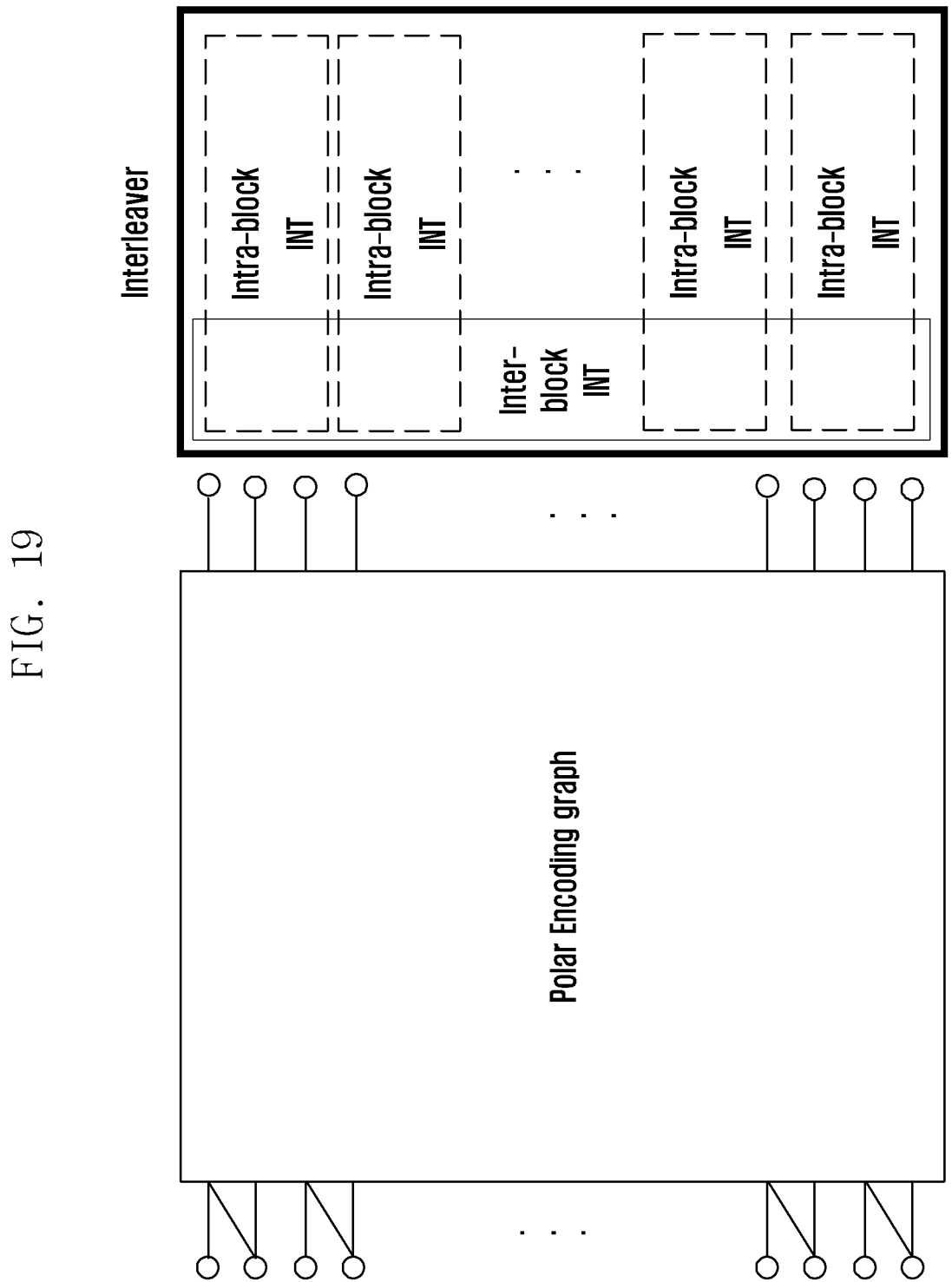
FIG. 19 is a diagram illustrating a connection between an interleaver and a polar code encoding graph according to an embodiment of the disclosure.

FIG. 19 is a diagram illustrating a connection between an interleaver and a polar code encoding graph according to an embodiment the disclosure.

Referring to FIG. 19, a plurality of intra-block INTs each represent an interleaver including short-length bits-to-symbol mappings described above, and each Intra-block INT is based on the use of the same bits-to-symbol mapping. The inter-block INT is used to construct the entire interleaver based on these small-sized interleavers.

The polar code bits included in the Intra-block INT are defined as bit groups consisting of m consecutive bits among the bit string [x0, x1, x2, x3, ..., xN−1], and each bit string may be exemplified as the following Equation 8.

$$X_i = \{x_{m*1+j} | 0 \leq j < m\} \text{ for } 0 \leq i < N/m \qquad \text{Equation 8}$$

The number of bits constituting the group may have a value larger than the number of bits constituting the modulation symbol. According to the embodiment of the disclosure, the number of bits constituting the group may be a multiple of the number of bits constituting the modulation symbol.

First, the combination with the sequential order will be described. In order to be combined with the puncturing/shortening/repeating of the sequential order, similarly, the inter-block INT of the embodiment of the disclosure operates in a sequential order. In this case, the Intra-block INT is an interleaver type considering the bits-to-symbol mapping during the high-order modulation as described above. For example, the Intra-block INT having the length of 16 for the 256-QAM in the above Table 1 described above is as follows:

{0, 3, 1, 2, 7, 4, 9, 5, 12, 11, 10, 6, 13, 14, 15, 8}.

In addition, if the Intra-block INT having a length of 16 is represented by i (a)=b, then it is expressed as follows:

Considering a sequential type inter-block INT, for example, a form of a final interleaver I(a)=b for a polar code in which a length of a mother matrix length is 64 is as follows:

$$I(0) = 0, I(1) = 3, \ldots, I(14) = 15, I(15) = 8,$$
$$I(16) = 16, I(17) = 19, \ldots, I(30) = 31, I(31) = 24,$$
$$\ldots$$
$$I(48) = 48, I(49) = 51, \ldots, I(62) = 63, I(63) = 56.$$

This may be expressed as shown in FIG. 20.

FIG. 20 illustrates an inter-block interleaving and intra-block interleaving of a final interleaver for a polar code in which a length of a mother matrix is 64 according to an embodiment of the disclosure.

Referring to FIG. 20, one row means one group representing intra-block interleaving, and a method of arranging each row follows inter-block interleaving. When combined with sequential puncturing/shortening/repeating, in FIG. 20, it becomes the final interleaver when read in row-by-row.

Hereinafter, the combination with the bit-reversal order will be described. For the combination with the puncturing/shortening/repeating of the bit-reversal order, the inter-block INT of the embodiment follows the bit-reversal order. Even in this case, the Intra-block INT is basically the interleaver type considering the bits-to-symbol mapping during the high-order modulation as described above. For example, the Intra-block INT having the length of 16 for the 256-QAM described in the above Table 1 described above is as follows:

{0, 3, 1, 2, 7, 4, 9, 5, 12, 11, 10, 6, 13, 14, 15, 8}.

In addition, if the Intra-block INT having a length of 16 is represented by i (a)=b, then it is expressed as follows:
i(0)=0,
i(1)=3.
i(2)=1,
i(13)=14,
i(14)=15,
i(15)=8.

Considering the bit-reversal type inter-block INT, a method for generating a final interleaver follows a final interleaver.

Stage 1) After the Inter-block INT is configured as a sequential type, each row is row permutated by bit reversal of each row based on row index.

Figure 21:
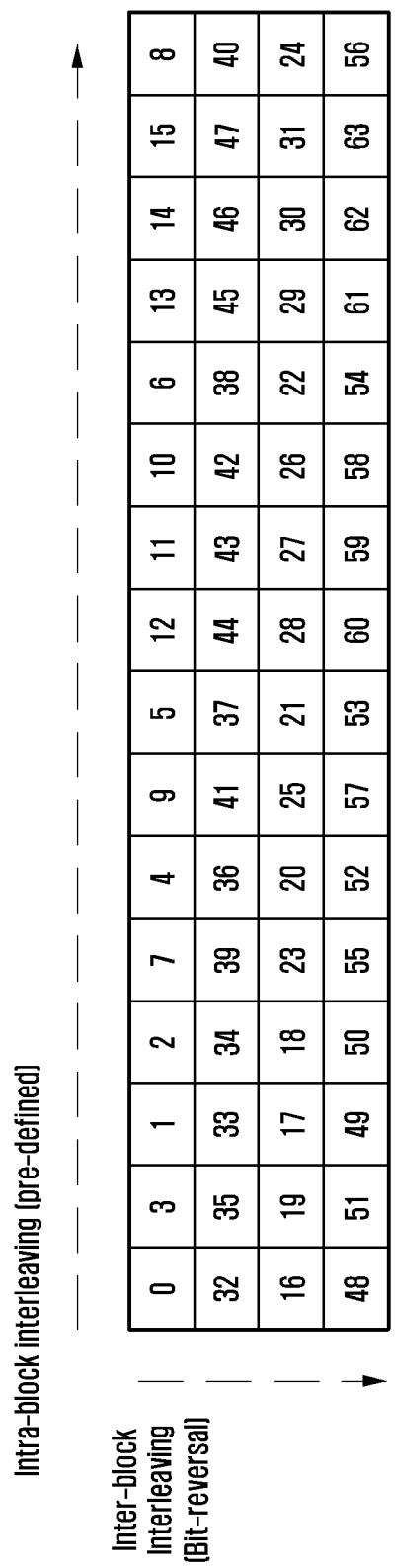
FIG. 21 illustrates an inter-block interleaving and intra-block interleaving according to various embodiments of the disclosure.

FIG. 21 illustrates an inter-block interleaving and intra-block interleaving according to an embodiment of the disclosure.

Referring to FIG. 21, a result in which four rows arranged in order is row permutated in bit-reversal order.

Stage 2) Each row (intra-block interleaving group) performs cyclic shift intra-row permutation by a row index.

FIG. 22 illustrates a cyclic shift intra-row permutation according to an embodiment of the disclosure.

Referring to FIG. 22, an i-th row is shifted to the left i times in FIG. 21 (i=0, 1, 2, ...).

Stage 3) Each column performs cyclic shift intra-column permutation by column index.

FIG. 23 illustrates a cyclic shift intra-column permutation according to an embodiment of the disclosure.

Referring to FIG. 23, an i-th column is shifted to the bottom i times in FIG. 22 as described above (i=0, 1, 2, ...).

Stage 4) Reading in column-by-column, a final interleaver which is combined with bit-reversal puncturing/shortening/repeating is obtained. For example, the form of the final interleaver I (a)=b having a length of 64 is as follows:
I(0)=0, 41)=35, I(2)=17, I(3)=50,
I(4)=55, I(5)=3, I(6)=33, I(7)=18,
I(60)=32, I(61)=19, 1(62)=49, 1(63)=8.

The bits stored in the buffer after being interleaved with the above pattern are sequentially mapped to the high-order modulation symbol. In addition, the interleaving performed by the above stage may store the relationship between the indices of the input bit stream $x_i$ (0≤i≤N) and the final output bit stream $z_i$ (0≤i≤N) as a table. In addition, the final output bit stream may be expressed as the following Equation 9.

$$z_i = x_{\pi(i)} \qquad \text{Equation 9}$$

For example, if the number of consecutive bits m=16 and N=64, the interleaving may be performed (based on Table 3 below).

TABLE 3

| | \multicolumn{11}{c}{π (i) 0 ≤ i < 32} |
|---|---|---|---|---|---|---|---|---|---|---|---|
| i | 0 | 1 | 2 | 3 | 4 | 5 | 6 | 7 | 8 | 9 | 10 |
| | 11 | 12 | 13 | 14 | 15 | 16 | 17 | 18 | 19 | 20 | 21 |
| | 22 | 23 | 24 | 25 | 26 | 27 | 28 | 29 | 30 | 31 | 32 |
| | 33 | 34 | 35 | 36 | 37 | 38 | 39 | 40 | 41 | 42 | 43 |
| | 44 | 45 | 46 | 47 | 48 | 49 | 50 | 51 | 52 | 53 | 54 |
| | 55 | 56 | 57 | 58 | 59 | 60 | 61 | 62 | 63 | | |
| π (i) | 0 | 35 | 17 | 50 | 55 | 3 | 33 | 18 | 23 | 52 | 1 |
| | 34 | 39 | 20 | 57 | 2 | 7 | 36 | 25 | 53 | 60 | 4 |
| | 41 | 21 | 28 | 59 | 9 | 37 | 44 | 27 | 58 | 5 | 12 |
| | 43 | 26 | 54 | 61 | 11 | 42 | 22 | 29 | 62 | 10 | 38 |
| | 45 | 30 | 63 | 6 | 13 | 46 | 31 | 56 | 48 | 14 | 47 |
| | 24 | 16 | 51 | 15 | 40 | 32 | 19 | 49 | 8 | | |

The process of interleaving $x_0, x_1, x_2, x_3, \ldots, x_{N-1}$ (where N is the number of polar encoded bits) which are an output sequence of a polar code and then generating an output bit is as follows when represented in a form of a block interleaver. The following stages will be described based on the combination with the puncturing/shortening/repeating of the bit-reversal order.

Stage 1) $N_c$=m, and $N_c$ is the number of columns of the block interleaver, and the index of the column is 0, 1, 2, ... $N_{c-1}$. The m may be the number of bits constituting the modulation symbol or may be a multiple of the number of bits constituting the symbol by a number larger than the number of bits.

Stage 2) $N_r$=N/m, and the $N_r$ is the number of rows of the block interleaver.

Stage 3) $b_{i,j}=x_i{}^*{}_{Nc+j}$, i=0, 1, ..., $N_r$, j=0, $b_{i,j}$ are input in row-by-row, starting from $b_{0,0}$ as the following Equation (10).

$$\begin{bmatrix} b_{0,0} & b_{0,1} & \cdots & b_{0,Nc-1} \\ b_{1,0} & b_{1,1} & \cdots & b_{1,Nc-1} \\ \vdots & \vdots & \ddots & \vdots \\ b_{Nr-1,0} & b_{Nr-1,1} & \cdots & b_{Nr-1,Nc-1} \end{bmatrix} \quad \text{Equation 10}$$

Stage 4) The inter-column permutation is performed by a predetermined pattern π (i) {0≤i<$N_c$}. One example of the inter-column permutation used in the following Equation 11 uses the pattern as the following Table 4.

$$\begin{bmatrix} b_{0,\pi(0)} & b_{0,\pi(1)} & \cdots & b_{0,\pi(Nc-1)} \\ b_{1,\pi(0)} & b_{1,\pi(1)} & \cdots & b_{1,\pi(Nc-1)} \\ \vdots & \vdots & \ddots & \vdots \\ b_{Nr-1,\pi(0)} & b_{Nr-1,\pi(1)} & \cdots & b_{Nr-1,\pi(Nc-1)} \end{bmatrix} \quad \text{Equation 11}$$

TABLE 4

| Nc | Inter-column permutation pattern π (0), π (1), π (1), ... π (Nc-1) | | | | | | | |
|---|---|---|---|---|---|---|---|---|
| 8 | 3 | 2 | 0 | 1 | 4 | 7 | 5 | 6 |

Stage 5) The inter-row permutation is performed by a predetermined pattern β (i) {0≤i<$N_r$}. For example, the bit-reversal order as the following Table 5 may be used. One example of the inter-row permutation used in the following Equation 12 uses the pattern as the following Table 5.

$$\begin{bmatrix} b_{\beta(0),\pi(0)} & b_{\beta(0),\pi(1)} & \cdots & b_{\beta(0),\pi(Nc-1)} \\ b_{\beta(1),\pi(0)} & b_{\beta(1),\pi(1)} & \cdots & b_{\beta(1),\pi(Nc-1)} \\ \vdots & \vdots & \ddots & \vdots \\ b_{\beta(Nr-1),\pi(0)} & b_{\beta(Nr-1),\pi(1)} & \cdots & b_{\beta(Nr-1),\pi(Nc-1)} \end{bmatrix} \quad \text{Equation 12}$$

TABLE 5

| Nr | Inter-column permutation pattern β (0), β (1), β (2), ... β (Nr-1) | | | |
|---|---|---|---|---|
| 4 | 0 | 2 | 1 | 3 |

Stage 6) The i-th row performs cyclic shift intra-row permutation by i. The following Equation 13 is a result of shifting the i-th row to the left by i in the above Equation 12 (i=0, 1, 2, ...).

$$\begin{bmatrix} b_{\beta(0),\pi(0)} & b_{\beta(0),\pi(1)} & \cdots & b_{\beta(0),\pi(Nc-1)} \\ b_{\beta(1),\pi(1)} & b_{\beta(1),\pi(2)} & \cdots & b_{\beta(1),\pi(0)} \\ \vdots & \vdots & \ddots & \vdots \\ b_{\beta(Nr-1),\pi(Nr-1)} & b_{\beta(Nr-1),\pi(Nr)} & \cdots & b_{\beta(Nr-1),\pi(Nr-2)} \end{bmatrix} \quad \text{Equation 13}$$

In the above Equation 13, it is assumed that $N_r<N_c$.

Stage 7) The i-th column performs cyclic shift intra-row permutation by i. In the above Equation 14, it is assumed that $N_r<N_c$. The following Equation 14 is a result of shifting the i-th column to the bottom by i in the above Equation 13 (i=0, 1, 2, ...).

$$\begin{bmatrix} b_{\beta(0),\pi(0)} & b_{\beta(Nr-1),\pi(Nr)} & \cdots & b_{\beta[Nr-Nc]\% Nr,\pi([Nr-Nc-1]\% Nr)} \\ b_{\beta(1),\pi(1)} & b_{\beta(0),\pi(1)} & \cdots & b_{\beta[Nr-Nc+1]\% Nr,\pi([Nr-Nc]\% Nr)} \\ \vdots & \vdots & \ddots & \vdots \\ b_{\beta(Nr-1),\pi(Nr-1)} & b_{\beta(Nr-2),\pi(Nr-1)} & \cdots & b_{\beta([2Nr-Nc-1]\% Nr),\pi([2Nr-Nc-2]\% Nr)} \end{bmatrix} \quad \text{Equation 14}$$

In the above Equation 14, [a]% b represents the remainder obtained by taking modulo, in which a is an integer and b is a natural number. Therefore, the result value is an integer larger than or equal to zero.

Stage 8) The inter-column, inter-row, intra-row permutation, and intra-column permutation bits are output in column by column.

When combining with the puncturing/shortening/repeating of the sequential order, the bits proceed to stage 4) and are output in row by row.

The interleaving procedure of the polar code according to the embodiment of the disclosure may be configured as follows. A method for coding a channel in a communication or broadcasting system includes: coding data based on a polar code, determining a modulation scheme to transmit the coded data, determining an interleaving method of the coded data according to the determined modulation scheme, applying interleaving to the coded data according to the determined interleaving method, and mapping the interleaved coded data to a modulation symbol.

Here, in the interleaving method, the interleaving pattern of a specific length may be repeated, and the interleaving pattern of the specific length may be set differently according to the modulation order. Finally, a transmitter apparatus to which the disclosure is applied will be described.

Figure 24:
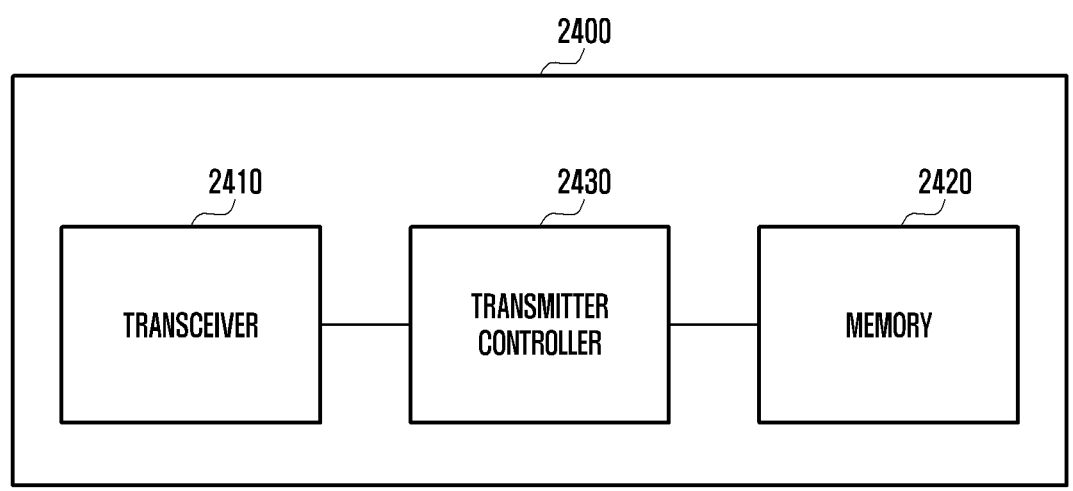
FIG. 24 is a functional block configuration diagram of a transmitter according to an embodiment of the disclosure.

FIG. 24 is a functional block configuration diagram of a transmitter according to an embodiment of the disclosure.

Referring to FIG. 24, a transmitter 2400 includes a transceiver 2410, a memory 2420, and a transmitter controller 2430.

The transceiver 2410 may transmit and receive a signal to and from the receiver.

The memory 2420 may store at least one of the information associated with the transmitter 2400 and the information transmitted and received through the transceiver 2410. In addition, the memory 2420 may store the sequence information for the polar coding to which the disclosure is applied.

The transmitter controller 2430 may control the operation of the transmitter 2400 and may control the entire transmitter 2400 so as to perform the operations associated with the transmitter 2400 in each embodiment described above. In addition, the transmitter controller 2430 may include at least one processor.

Figure 25:
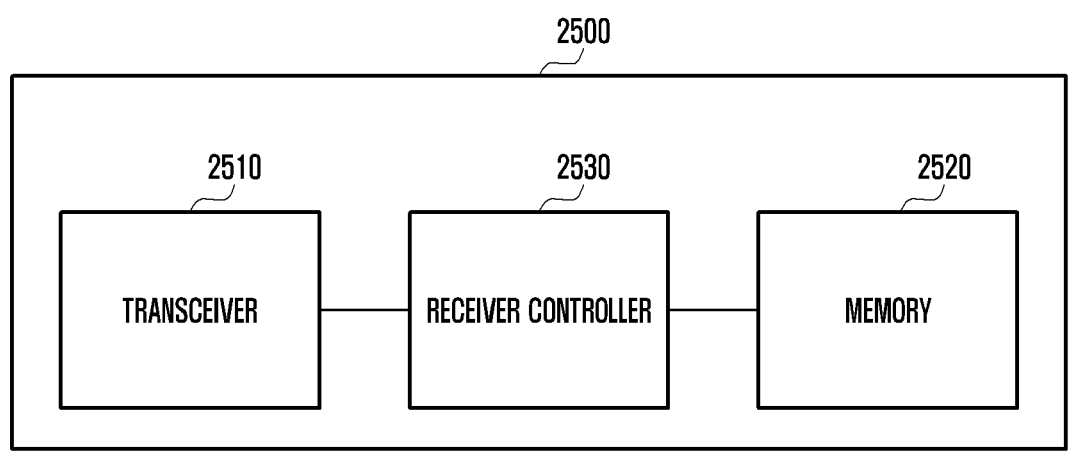
FIG. 25 is a functional block configuration diagram of a receiver according to an embodiment of the disclosure.

FIG. 25 is a functional block configuration diagram of a receiver according to an embodiment of the disclosure.

Referring to FIG. 25, a receiver 2500 to which the disclosure is applied includes a transceiver 2510, a memory 2520, and a receiver controller 2530.

The transceiver 2510 may transmit and receive signals to and from the transmitter and other network entities.

The memory 2520 may store at least one of the information associated with the receiver 2500 and the information transmitted and received through the transceiver 2510.

The controller 2630 may control the operation of the receiver 2500 and may control the overall receiver to perform the operations associated with the receiver described in the above embodiments. In addition, the receiver controller 2530 may include at least one processor.

Certain aspects of the disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a Read-Only Memory (ROM), a Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the disclosure can be easily construed by programmers skilled in the art to which the disclosure pertains.

At this point it should be noted that the various embodiments of the disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the disclosure as described above. Alternatively, one or more processors operating in accordance with stored instructions may implement the functions associated with the various embodiments of the disclosure as described above. If such is the case, it is within the scope of the disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the disclosure can be easily construed by programmers skilled in the art to which the disclosure pertains.

While the disclosure has been shown and described with reference to various embodiments thereof, it will be understood by those skilled in the art that various in form and details may be made without departing from the spirit and scope of the disclosure as defined by the appended claims and their equivalents.

What is claimed is:

1. A method for coding a channel in a communication system, the method comprising:
   coding information to be transmitted with an outer code;
   generating an input sequence by allocating outer coded symbols of the outer coded information sequentially from a sub-channel having a large capacity based on a polar code sequence, the input sequence having a value of 2n and n being a preset value;
   coding the input sequence with the polar code;
   interleaving polar coded symbols of the polar coded input sequence according to a predetermined scheme in consideration of a modulation symbol; and
   modulating the interleaved polar coded symbols.

2. The method of claim 1,
   wherein the polar code sequence is designed in consideration of a binary phase shift keying (BPSK) or quadrature phase shift keying (QPSK) modulation scheme, and
   wherein, when the modulation scheme uses more than a quadrature amplitude modulation (QAM) modulation scheme, in the interleaving, the interleaving is performed using a bits-to-symbol mapping matrix based on reliability depending on locations of bits configuring each modulation symbol.

3. The method of claim 2, wherein, when the polar code bits having a longer length than the bits-to-symbol mapping matrix upon the interleaving are transmitted, the interleaving is performed repeatedly in the bits-to-symbol mapping matrix in the polar code sequence.

4. The method of claim 2, wherein the bits-to-symbol mapping matrix is configured to:
   calculate first mutual information for each bit location on a signal to noise ratio (SNR) basis in an additive white Gaussian noise (AWGN) channel,
   calculate second mutual information for each subchannel every possible bit-symbol mapping by either of density evolution or Gaussian approximation, and
   calculate a difference between the polar code sequence and a target code sequence using the second mutual information to select and configure bits-to-symbol mapping having a smallest difference.

5. The method of claim 2, wherein the bits-to-symbol mapping matrix is configured to:
   be set as a matrix equal to or larger than a device configuring one QAM symbol, and
   maximize a separation between bits belonging to one QAM symbol.

6. The method of claim 5, wherein, when the bits-to-symbol mapping matrix is used for the polar coded symbols coded with the polar code twice or more, interleaving between the bits-to-symbol mapping matrices is further performed corresponding to a size of the bits-to-symbol mapping matrix.

7. The method of claim 6, wherein the interleaving between the bits-to-symbol mapping matrices comprises:
sequentially arranging rows in a device interleaved by the bits-to-symbol mapping matrix;
rearranging each row by row-permuting an order of the respective rows in a bit-reversal order;
rearranging bits arranged in each column by cyclically shifting the bits by each row index per row; and
rearranging bits arranged in each column by cyclically shifting the bits by each column index per column.

8. The method of claim 1, wherein the allocating of the outer coded symbols to the channel comprises:
determining a location where information is not carried by puncturing or shortening performed to adjust a length of a code after the outer coding is performed; and
generating an input sequence by mapping the outer coded symbols to a bit other than the determined location.

9. The method of claim 1, wherein the allocating of the outer coded symbols to the channel by mapping the outer coded symbols to the bit sequence comprises:
generating a predetermined number of parity bits by performing a predetermined pre-coding on the outer coded symbol; and
generating the input sequence using both of the generated parity bit and the outer coded symbol.

10. The method of claim 1, wherein the interleaving further comprises performing rate matching when the length of the polar-coded symbol is longer than the length of the symbol of the code transmitted as the modulation symbol.

11. The method of claim 1, wherein the outer code includes at least one of an error detection code including a cyclic redundancy check (CRC) code or an error-correcting code including at least one of a Bose, Chaudhuri, and Hocquenghem (BCH) code or a single parity check code.

12. An apparatus for coding a channel in a communication system, the apparatus comprising:
an outer coder configured to code information to be transmitted with an outer code;
a subchannel allocator configured to generate an input sequence by allocating outer coded symbols of the outer coded information sequentially from a sub-channel having a large capacity based on a polar code sequence, the input sequence having a value of $2^n$ and n being a preset value;
a polar code coder configured to perform polar code coding on the polar code sequence in a predetermined scheme;
an interleaver configured to interleave polar coded symbols of the polar coded input sequence by a predetermined scheme; and
a modulator configured to modulate the interleaved polar coded symbols.

13. The apparatus of claim 12, wherein the interleaver is further configured to:
design the polar code sequence in consideration of a binary phase shift keying (BPSK) or quadrature phase shift keying (QPSK) modulation scheme, and
perform the interleaving using a bits-to-symbol mapping matrix based on reliability depending on locations of bits configuring each modulation symbol when the modulation scheme uses more than a quadrature amplitude modulation (QAM) modulation scheme.

14. The apparatus of claim 13, wherein the interleaver is further configured to repeatedly perform the interleaving in the bits-to-symbol mapping matrix in the polar code sequence when the polar code bits having a longer length than the bits-to-symbol mapping matrix upon the interleaving are transmitted.

15. The apparatus of claim 13, wherein the bits-to-symbol mapping matrix is configured to:
calculate first mutual information for each bit location on a signal to noise ratio (SNR) basis in an additive white Gaussian noise (AWGN) channel,
calculate second mutual information for each subchannel every possible bit-symbol mapping by either of density evolution or Gaussian approximation, and
calculate a difference between the polar code sequence and a target code sequence using the second mutual information to select and configure bits-to-symbol mapping having a smallest difference.

16. The apparatus of claim 13, wherein the bits-to-symbol mapping matrix is configured to:
be set as a matrix equal to or larger than a device configuring one QAM symbol, and
maximize a separation between bits belonging to one QAM symbol.

17. The apparatus of claim 16, wherein, when the bits-to-symbol mapping matrix is used for the polar coded symbols coded with the polar code twice or more, interleaving between the bits-to-symbol mapping matrices is further performed corresponding to a size of the bits-to-symbol mapping matrix.

18. The apparatus of claim 17, wherein the interleaving between the bits-to-symbol mapping matrices comprises:
sequentially arranging rows in a device interleaved by the bits-to-symbol mapping matrix;
rearranging each row by row-permuting an order of the respective rows in a bit-reversal order;
rearranging bits arranged in each column by cyclically shifting the bits by each row index per row; and
rearranging bits arranged in each column by cyclically shifting the bits by each column index per column.

19. The apparatus of claim 12, wherein the subchannel allocator is further configured to:
determine a location where information is not carried by puncturing or shortening performed to adjust a length of a code after the outer coding is performed, and
generate an input sequence by mapping the outer coded symbols to a bit other than the determined location.

20. The apparatus of claim 12, wherein the allocating of the outer coded symbols to the channel by mapping the outer coded symbols to the bit sequence generates a predetermined number of parity bits by predetermined pre-coding and generates the input sequence using both of the generated parity bit and the outer coded symbol.

21. The apparatus of claim 12, wherein the interleaver is further configured to perform rate matching when the length of the polar-coded symbol is longer than the length of the symbol of the code transmitted as the modulation symbol.

22. The apparatus of claim 12, wherein the outer code includes at least one of an error detection code including a cyclic redundancy check (CRC) code or an error-correcting code including at least one of a Bose, Chaudhuri, and Hocquenghem (BCH) code or a single parity check code.

* * * * *